(12) United States Patent
Baek et al.

(10) Patent No.: US 9,812,450 B2
(45) Date of Patent: Nov. 7, 2017

(54) SEMICONDUCTOR DEVICES AND METHODS OF MANUFACTURING THE SAME

(71) Applicant: Samsung Electronics Co., Ltd., Suwon-Si, Gyeonggi-do (KR)

(72) Inventors: Jong-Min Baek, Seoul (KR); Sang-Hoon Ahn, Goyang-si (KR); Woo-Kyung You, Incheon (KR); Byung-Hee Kim, Seoul (KR); Young-Ju Park, Hwaseong-si (KR); Nae-in Lee, Seoul (KR); Kyung-Min Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/006,265

(22) Filed: Jan. 26, 2016

(65) Prior Publication Data
US 2016/0307842 A1 Oct. 20, 2016

(30) Foreign Application Priority Data
Apr. 14, 2015 (KR) .................. 10-2015-0052108

(51) Int. Cl.
- *H01L 23/522* (2006.01)
- *H01L 27/088* (2006.01)
- *H01L 21/8234* (2006.01)

(52) U.S. Cl.
CPC .. *H01L 27/0886* (2013.01); *H01L 21/823431* (2013.01); *H01L 21/823475* (2013.01)

(58) Field of Classification Search
CPC .................................................. H01L 27/0886
See application file for complete search history.

(56) References Cited

U.S. PATENT DOCUMENTS

| | | | | |
|---|---|---|---|---|
| 6,159,845 A | * | 12/2000 | Yew | H01L 21/7681 257/E21.579 |
| 6,403,461 B1 | | 6/2002 | Tae et al. | |
| 6,908,829 B2 | | 6/2005 | Hussein et al. | |
| 7,199,043 B2 | * | 4/2007 | Park | H01L 21/76877 257/E21.166 |
| 7,326,444 B1 | * | 2/2008 | Wu | C23C 16/401 257/E21.277 |
| 7,449,407 B2 | | 11/2008 | Lur et al. | |
| 7,473,632 B2 | | 1/2009 | Ueda | |
| 7,749,891 B2 | | 7/2010 | Ueda | |
| 7,830,014 B2 | | 11/2010 | Ueda | |
| 7,928,003 B2 | | 4/2011 | Naik | |
| 8,829,682 B2 | | 9/2014 | Kim et al. | |

(Continued)

FOREIGN PATENT DOCUMENTS

| | | |
|---|---|---|
| KR | 1020060114181 A | 11/2006 |
| KR | 1020110013162 A | 2/2011 |
| KR | 1020110053098 A | 5/2011 |

*Primary Examiner* — Long Pham
(74) *Attorney, Agent, or Firm* — Ward and Smith, P.A.

(57) ABSTRACT

A semiconductor device includes a plurality of wiring structures spaced apart from each other, and an insulating interlayer structure. Each of the wiring structures includes a metal pattern and a barrier pattern covering a sidewall, a bottom surface, and an edge portion of a top surface of the metal pattern and not covering a central portion of the top surface of the metal pattern. The insulating interlayer structure contains the wiring structures therein, and has an air gap between the wiring structures.

10 Claims, 36 Drawing Sheets

(56) References Cited

U.S. PATENT DOCUMENTS

2008/0246151 A1* 10/2008 Yang ................ H01L 21/76807
　　　　　　　　　　　　　　　　　　　　　　257/751
2014/0191401 A1　　7/2014　Fischer

* cited by examiner

SEMICONDUCTOR DEVICES AND METHODS OF MANUFACTURING THE SAME

CROSS-REFERENCE TO RELATED APPLICATION

This application claims priority under 35 USC §119 to Korean Patent Application No. 10-2015-0052108, filed on Apr. 14, 2015 in the Korean Intellectual Property Office (KIPO), the contents of which are herein incorporated by reference in their entirety.

BACKGROUND

In order to prevent cross-talk due to an RC delay, an air gap may be formed between wiring structures each having a copper wiring and a barrier layer covering a bottom and a sidewall of the copper wiring. In order to form the air gap, a portion of an insulating interlayer between the wiring structures may be removed, and an upper edge portion of the wiring structure may be also removed. Thus, an electric field may concentrate on an upper edge portion of the copper wiring, which may deteriorate the reliability of the semiconductor device including the wiring structure.

SUMMARY

Some example embodiments provide semiconductor devices having a high reliability.

Some example embodiments provide methods of manufacturing a semiconductor device having a high reliability.

According to some example embodiments, there is provided a semiconductor device. The semiconductor device includes a plurality of wiring structures spaced apart from each other, and an insulating interlayer structure. Each of the wiring structures includes a metal pattern and a barrier pattern covering a sidewall, a bottom surface, and an edge portion of a top surface of the metal pattern and not on a central portion of the top surface of the metal pattern. The insulating interlayer structure contains the wiring structures therein, and has an air gap between the wiring structures.

In some example embodiments, the semiconductor device may further include a diffusion barrier layer covering a top surface and at least a sidewall of each of the wiring structures.

In some example embodiments, the diffusion barrier layer may cover a sidewall of each of the wiring structures adjacent the air gap.

In some example embodiments, the diffusion barrier layer may define a bottom and a sidewall of the air gap.

In some example embodiments, the diffusion barrier layer may include silicon nitride, silicon carbonitride, silicon carboxide, and/or silicon oxycarbonitride.

In some example embodiments, the insulating interlayer structure may include first and second insulating interlayers sequentially stacked, and the diffusion barrier layer may be formed between the first and second insulating interlayers.

In some example embodiments, a top of the air gap may be defined by the second insulating interlayer, and a bottom and a sidewall of the air gap may be defined by the diffusion barrier layer.

In some example embodiments, each of the first and second insulating interlayers may include a low-k dielectric material.

In some example embodiments, each of the first and second insulating interlayers may include silicon oxide doped with carbon.

In some example embodiments, each of the wiring structures may include a lower portion and an upper portion integrally formed with the lower portion. The upper portion may have a width greater than a width of the lower portion.

In some example embodiments, the metal pattern may include copper, aluminum or tungsten, and the barrier pattern may include tantalum nitride, titanium nitride, tantalum and/or titanium.

In some example embodiments, the central portion of the top surface of the metal pattern may be higher than the edge portion of the top surface of the metal pattern.

According to some example embodiments, there is provided a semiconductor device. The semiconductor device includes a plurality of first wiring structures spaced apart from each other, a plurality of second wiring structures spaced apart from each other, and an insulating interlayer structure. Each of the first and second wiring structures includes a metal pattern and a barrier pattern on a sidewall, a bottom surface, and an edge portion of a top surface of the metal pattern and not on a central portion of the top surface of the metal pattern. The insulating interlayer structure contains the first and second wiring structures therein, and has an air gap between the first wiring structures.

In some example embodiments, a distance between the first wiring structures may be smaller than a distance between the second wiring structures.

In some example embodiments, the semiconductor device may further include first and second diffusion barrier structures covering top surfaces of the first and second wiring structures, respectively.

In some example embodiments, the first diffusion barrier structure may cover a sidewall of both sidewalls of each of the first wiring structures adjacent the air gap.

In some example embodiments, the first diffusion barrier structure may define a bottom and a sidewall of the air gap.

In some example embodiments, a thickness of the second diffusion barrier structure covering the top surfaces of the second wiring structures may be greater than a thickness of the first diffusion barrier structure covering the top surfaces of the first wiring structures at each side of which the air gap is formed.

In some example embodiments, the insulating interlayer structure may include first and second insulating interlayers sequentially stacked, and the first and second diffusion barrier layers may be formed between the first and second insulating interlayers.

According to some example embodiments, there is provided a semiconductor device. The semiconductor device includes an active fin, a plurality of gate structures, a source/drain layer, contact plugs, a plurality of wiring structures, and an insulating interlayer. The active fin is defined by an isolation pattern on a substrate. The plurality of gate structures is spaced apart from each other on the active fin. The source/drain layer is formed on the active fin adjacent each of the gate structures. The contact plugs are formed on the source/drain layers, respectively. The plurality of wiring structures is formed on the contact plugs, respectively. Each of the wiring structures includes a metal pattern, and a barrier pattern covering a sidewall, a bottom surface, and an edge portion of a top surface of the metal pattern and not covering a central portion of the top surface of the metal pattern. The insulating interlayer structure contains the wiring structures therein, and has an air gap between the wiring structures.

In some example embodiments, each of the gate structures may include a gate insulation pattern and a gate electrode sequentially stacked, and the gate insulation pattern and the gate electrode may include a high-k dielectric material and a metal, respectively.

In some example embodiments, a bottom and a sidewall of the gate electrode may be covered by the gate insulation pattern.

In some example embodiments, each of the source/drain layer may include silicon, silicon carbide, or silicon-germanium.

In some example embodiments, the plurality of wiring structures may include a plurality of first wiring structures and a plurality of second wiring structures, and the first wiring structures may be spaced apart from each other at distance smaller than a distance between the second wiring structures spaced apart from each other. The air gap may be formed between the plurality of first wiring structures.

In some example embodiments, the semiconductor device may further include a first diffusion barrier structure and a second diffusion barrier structure. The first diffusion barrier structure may cover a top surface of each of the first wiring structures and a sidewall of each of the first wiring structures adjacent the air gap. The second diffusion barrier structure may cover a top surface of each of the second wiring structures.

In some example embodiments, a thickness of the second diffusion barrier structure covering the top surfaces of the second wiring structures may be greater than a thickness of the first diffusion barrier structure covering the top surfaces of ones of the first wiring structures at each side of which the air gap is formed.

According to some example embodiments, there is provided a method of manufacturing a semiconductor device. In the method, a plurality wiring structures is formed to fill a plurality of trenches, respectively, in a first insulating interlayer. A portion of the first insulating interlayer between the wiring structures is removed by a remote plasma etching process to form a recess. A diffusion barrier layer is formed on an inner wall of the recess, the wiring structures and the first insulating interlayer. A second insulating interlayer is formed on the diffusion barrier layer to form an air gap between the second insulating interlayer and the diffusion barrier layer.

In some example embodiments, when the plurality wiring structures are formed to fill the plurality of trenches, respectively, in the first insulating interlayer, a barrier layer may be formed on the inner walls of the trenches and the first insulating interlayer. A metal layer may be formed on the barrier layer to fill remaining portions of the trenches. The metal layer and the barrier layer may be planarized until a top surface of the first insulating interlayer may be exposed to form a metal pattern and a barrier pattern in each of the trenches.

In some example embodiments, a central portion of a top surface of the metal pattern may be formed to be higher than an edge portion thereof.

In some example embodiments, an uppermost portion of the barrier pattern may not contact the metal pattern.

In some example embodiments, the diffusion barrier layer may be a second diffusion barrier layer. After forming the plurality wiring structures to fill the plurality of trenches, respectively, on the first insulating interlayer, a first diffusion barrier layer may be further formed on the wiring structures and the first insulating interlayer.

In some example embodiments, during forming the first diffusion barrier layer on the wiring structures and the first insulating interlayer, the uppermost portion of the barrier pattern may contact the top surface of the metal pattern.

In some example embodiments, the first and second diffusion barrier layers may include substantially the same material to be merged with each other.

In some example embodiments, when the portion of the first insulating interlayer between the wiring structures is removed by the remote plasma etching process to form the recess, a mask including an opening overlapping a portion of the first insulating interlayer between the wiring structures may be formed on the first diffusion barrier layer. A portion of the first diffusion barrier layer exposed by the opening may be etched. The portion of the first insulating interlayer between the wiring structures may be etched.

In some example embodiments, the opening may overlap at least a portion of a top surface each of the wiring structures.

According to some example embodiments, there is provided a method of manufacturing a semiconductor device. In the method, a plurality of wiring structure is formed to fill a plurality of trenches, respectively, in a first insulating interlayer. A portion of the first insulating interlayer between the wiring structures is removed by an isotropic etching process to form a recess. A diffusion barrier layer is formed on an inner wall of the recess, the wiring structures and the first insulating interlayer. A second insulating interlayer is formed on the diffusion barrier layer to form an air gap between the second insulating interlayer and the diffusion barrier layer.

In some example embodiments, when the portion of the first insulating interlayer between the wiring structures is removed by the isotropic etching process to form the recess, a wet etching process may be performed.

In some example embodiments, when the portion of the first insulating interlayer between the wiring structures is removed by the isotropic etching process to form the recess, a remote plasma etching process may be performed.

In some example embodiments, when the plurality of wiring structure are formed to fill the plurality of trenches, respectively, in the first insulating interlayer, a barrier layer may be formed on the inner walls of the trenches and the first insulating interlayer. A metal layer may be formed on the barrier layer to fill remaining portions of the trenches. The metal layer and the barrier layer may be planarized until a top surface of the first insulating interlayer may be exposed to form a metal pattern and a barrier pattern in each of the trenches.

In some example embodiments, the diffusion barrier layer may be a second diffusion barrier layer. After the plurality of wiring structure are formed to fill the plurality of trenches, respectively, in the first insulating interlayer, a first diffusion barrier layer may be formed on the wiring structures and the first insulating interlayer so that an uppermost portion of the barrier pattern may contact a top surface of the metal pattern.

In the semiconductor device in accordance with some example embodiments, the wiring structures may be formed in the insulating interlayer structure including the low-k dielectric material, and thus the parasitic capacitance may be low. Particularly, the air gap having a dielectric constant of 1 may be formed between the neighboring wiring structures, so that the parasitic capacitance may be lower.

The metal pattern of each of the wiring structures may be covered by the barrier pattern except for the central portion of the top surface thereof, and particularly, the portion of the metal pattern at which the top surface and the sidewall thereof face each other may be covered by the barrier pattern well. Thus, when a voltage is applied to the metal pattern, the electric field may not concentrate on a specific portion thereof, and the deterioration of the reliability of the semiconductor device due to the migration of metal included in the metal pattern may be prevented.

Some embodiments of the present inventive concept include semiconductor devices, which include a plurality of wiring structures that extend in a first direction and that are spaced apart from each other in a second direction that is different from the first direction. Each of the plurality of wiring structures including a metal pattern and a barrier pattern on a sidewall, a bottom surface, and an edge portion of a top surface of the metal pattern and not on a central portion of the top surface of the metal pattern. Devices may include an insulating interlayer structure that contains the wiring structures therein and that includes an air gap that extends in the first direction and that is between ones of the plurality of wiring structures.

In some embodiments, a first portion of the plurality of wiring structures are separated by the air gap and a second portion of the plurality of wiring structures are not separated by the air gap. Some embodiments provide that the first portion of the plurality of wiring structures are a first distance apart from one another and the second portion of the plurality of wiring structures are a second distance apart from one another that is greater than the first distance.

Some embodiments include a diffusion barrier layer on a top surface and at least a sidewall of each of the first portion of the plurality of wiring structures. In some embodiments, the diffusion barrier layer covers a sidewall of each of the first portion of the plurality of wiring structures that are adjacent the air gap and the diffusion barrier layer includes silicon nitride, silicon carbonitride, silicon carboxide, and/or silicon oxycarbonitride.

Some embodiments provide that the insulating interlayer structure comprises first and second insulating interlayers that are sequentially stacked. In some embodiments, the diffusion barrier layer is formed between the first and second insulating interlayers and a top of the air gap is defined by the second insulating interlayer, and a bottom and a sidewall of the air gap are defined by the diffusion barrier layer.

In some embodiments, the central portion of the top surface of the metal pattern is higher than the edge portion of the top surface of the metal pattern.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following detailed description taken in conjunction with the accompanying drawings. FIGS. 1 to 46 represent non-limiting, example embodiments as described herein.

FIGS. 2 to 8 are cross-sectional views illustrating stages of a method of manufacturing a semiconductor device in accordance with some example embodiments;

FIG. 9 is a cross-sectional view illustrating a semiconductor device in accordance with some example embodiments;

FIG. 10 is a cross-sectional view illustrating a stage of a method of manufacturing a semiconductor device in accordance with some example embodiments;

FIG. 11 is a cross-sectional view illustrating a semiconductor device in accordance with some example embodiments;

FIGS. 12 to 14 are cross-sectional views illustrating stages of a method of manufacturing a semiconductor device in accordance with example embodiments;

FIG. 15 is a cross-sectional view illustrating a semiconductor device in accordance with some example embodiments;

FIGS. 16 to 19 are a plan view and cross-sectional views illustrating a semiconductor device in accordance with some example embodiments; and FIGS. 20 to 46 are plan views and cross-sectional views illustrating stages of a method of manufacturing a semiconductor device in accordance with some example embodiments.

DETAILED DESCRIPTION

Figure 1A:
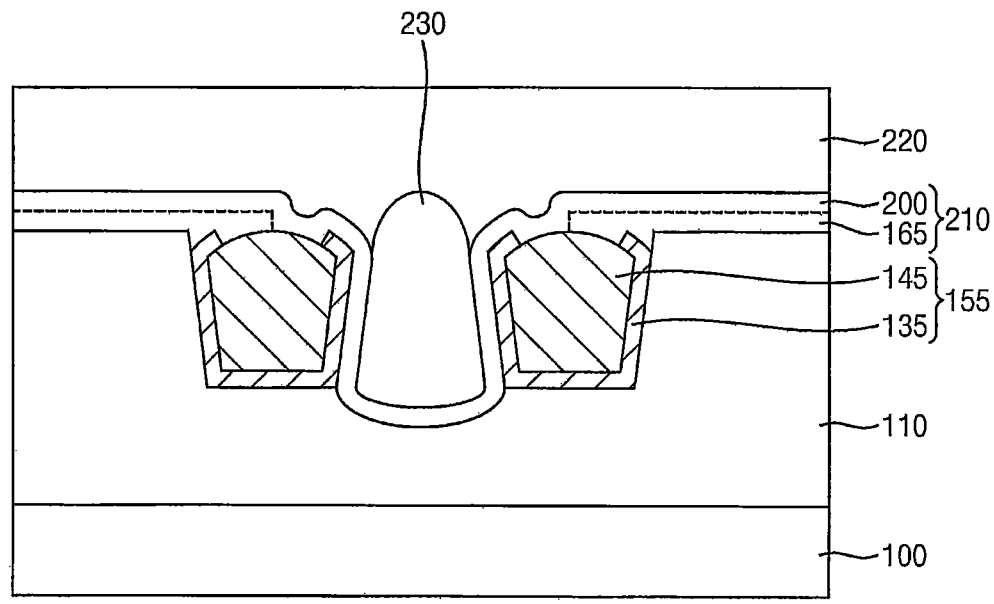
FIGS. 1A and 1B are cross-sectional views illustrating a semiconductor device in accordance with some example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
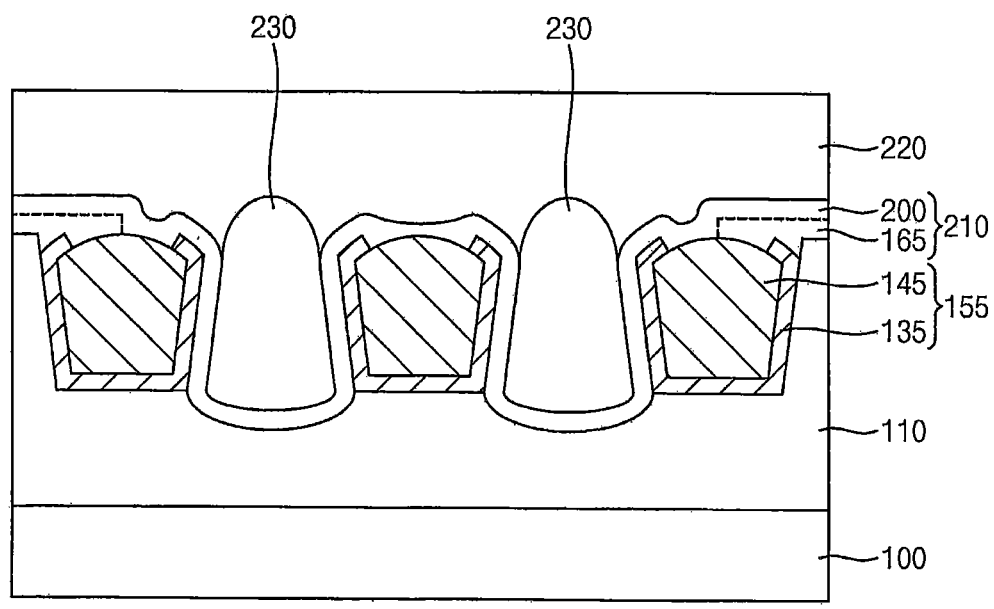

FIGS. 1A and 1B are cross-sectional views illustrating a semiconductor device in accordance with some example embodiments. FIG. 1A shows two wiring structures in an insulating interlayer structure, and FIG. 1B shows three wiring structures in the insulating interlayer structure. However, the inventive concepts may not be limited thereto, and any semiconductor device may be included in the scope of the inventive concepts if the semiconductor device includes an insulating interlayer structure having one or a plurality of wiring structures therein.

Referring to FIGS. 1A and 1B, the semiconductor device may include an insulating interlayer structure and wiring structures 155 on a substrate 100. The semiconductor device may further include a diffusion barrier structure 210.

The substrate 100 may include a semiconductor material, e.g., silicon, germanium, silicon-germanium, etc., or III-V semiconductor compounds, e.g., GaP, GaAs, GaSb, etc. In some example embodiments, the substrate 100 may be a silicon-on-insulator (SOI) substrate or a germanium-on-insulator (GOI) substrate.

The insulating interlayer structure may include first and second insulating interlayers 110 and 220 sequentially stacked on the substrate 100, and may contain the wiring structures 155 therein. In some example embodiments, the first insulating interlayer 110 may cover bottom surfaces of the wiring structures 155, and the second insulating interlayer 220 may cover top surfaces of the wiring structures 155. The first insulating interlayer 110 may also cover outer sidewalls of outermost ones of the wiring structures 155.

Each of the first and second insulating interlayers 110 and 220 may include a low-k dielectric material, e.g., silicon oxide doped with carbon (SiCOH) or silicon oxide doped with fluorine (F—$SiO_2$), a porous silicon oxide, spin on organic polymer, or an inorganic polymer, e.g., hydrogen silsesquioxane (HSSQ), methyl silsesquioxane (MSSQ), etc.

The diffusion barrier structure 210 may be formed between the first and second insulating interlayers 110 and 220, and may cover the wiring structures 155 except for bottom surfaces thereof. That is, the diffusion barrier structure 210 may cover a top surface and opposed sidewalls of each of the wiring structures 155, and a top surface of the first insulating interlayer 110, and the second insulating interlayer 220 may be formed on the diffusion barrier structure 210. However, the outer sidewalls of the outermost ones of the wiring structures 155 may be covered by the first insulating interlayer 110, and thus only inner sidewalls of the outermost ones of the wiring structures 155 may be covered by the diffusion barrier structure 210.

The first insulating interlayer 110 may be formed beneath the wiring structures 155, and the diffusion barrier structure 210 and the second insulating interlayer 220 may be sequentially formed on the wiring structures 155. Opposed sidewalls of each of the wiring structures 155 except for the outermost ones of the wiring structures 155 may be covered by the diffusion barrier structure 210, and the outer and inner sidewalls of the outermost ones of the wiring structures 155 may be covered by the first insulating interlayer 110 and the diffusion barrier structure 210, respectively.

The air gap 230 may be formed between the wiring structures 155. Particularly, the air gap 230 may be formed between portions of the diffusion barrier structure 210 covering sidewalls of neighboring ones of the wiring structures 155. A top of the air gap 230 may be defined by the second insulating interlayer 220, and a bottom and a sidewall of the air gap 230 may be defined by the diffusion barrier structure 210.

In some example embodiments, the air gap 230 may have a rounded triangular shape in which a width of a lower portion is greater than a width of an upper portion. However, the inventive concepts may not be limited thereto, and the shape of the air gap 230 may vary according to the shapes of the neighboring wiring structures 155, the diffusion barrier structure 210, and the second insulating interlayer 220. FIGS. 1A and 1B show that the bottom of the air gap 230 is lower than the bottom surfaces of the wiring structures 155 and the top of the air gap 230 is higher than the top surfaces of the wiring structures 155, however, the inventive concepts may not be limited thereto.

In some example embodiments, the diffusion barrier structure 210 may include a first diffusion barrier pattern 165 and a second diffusion barrier 200. The first diffusion barrier pattern 165 may cover the top surface of the first insulating interlayer 110 and a portion of the top surface of each of the outermost ones of the wiring structures 155, and the second diffusion barrier layer 200 may cover a top surface of the first diffusion barrier pattern 165, and the top surfaces and the sidewalls of the wiring structures 155. The portion of the top surface of each of the outermost ones of the wiring structures 155 covered by the first diffusion barrier pattern 165 may be a portion of the top surface of each of the outermost ones of the wiring structures 155 adjacent the outer sidewall thereof. A portion of the top surface of each of the outermost ones of the wiring structures 155 not covered by the first diffusion barrier pattern 165 may be covered by the second diffusion barrier layer 200.

However, the first diffusion barrier pattern 165 may not cover the top surfaces of the outermost ones of the wiring structures 155 at all, but may cover only the top surface of the first insulating interlayer 110, and in this case, the whole portion of the top surfaces of the outermost ones of the wiring structures 155 may be also covered by the second diffusion barrier layer 200.

The first diffusion barrier pattern 165 and the second diffusion barrier layer 200 may include a nitride, e.g., silicon nitride, silicon carbonitride, silicon carboxide, silicon oxycarbonitride, etc. In some example embodiments, the first diffusion barrier pattern 165 and the second diffusion barrier layer 200 may include substantially the same material, and thus may be merged with each other. In this case, in the diffusion barrier structure 210 including a single layer, a first portion, which may be formed on the top surface of the first insulating interlayer 110 and the portion of the top surface of each of the outermost ones of the wiring structures 155 adjacent the outer sidewall thereof, may have a first thickness greater than a second thickness of a second portion, which may be formed on the top surfaces and the sidewalls of the wiring structures 155 except for the outermost ones of the wiring structures 155.

Each of the wiring structure 155 may include a metal pattern 145, and a barrier pattern 135 covering a bottom surface, a sidewall, and an edge portion of a top surface of the metal pattern 145. The barrier pattern 135 may not cover a central portion of the top surface of the metal pattern 145.

In some example embodiments, a cross-section of the metal pattern 145 along a vertical direction may include a bottom surface and a sidewall having a linear shape, and a top surface having a curved shape. That is, the top surface of the cross-section of the metal pattern 145 along the vertical direction may have a curved shape convex upward in which a central portion is higher than an edge portion. FIGS. 1A and 1B show that the top surface and the sidewall of the cross-section of the metal pattern 145 meet or contact each other sharply, however, the inventive concepts may not be limited thereto, but they may meet or contact each other smoothly. That is, the cross-section of the metal pattern 145 may have a rounded shape at an area in which the top surface and the sidewall thereof face each other.

In some example embodiments, the barrier pattern 135 may stick to the bottom surface, the sidewall and the edge portion of the top surface of the metal pattern 145, and may have a constant thickness. Thus, an uppermost portion of the barrier pattern 135 may be bent from the sidewall of the metal pattern 145 toward the top surface thereof, and may have a curved shape corresponding to the shape of the top surface of the metal pattern 145.

The metal pattern 145 may include a metal, e.g., copper, aluminum, tungsten, etc., and the barrier pattern 135 may include a metal nitride, e.g., tantalum nitride, titanium nitride, etc., and/or a metal, e.g., tantalum, titanium, etc.

A liner (not shown) may be further formed between the metal pattern 145 and the barrier pattern 135. The liner may include a metal, e.g., cobalt, ruthenium, etc.

As illustrated above, the wiring structures 155 may be formed in the insulating interlayer structure including the low-k dielectric material, and thus the parasitic capacitance may be low. Particularly, the air gap 230 having a dielectric constant of 1 may be formed between neighboring wiring structures 155, so that the parasitic capacitance may be lower.

The metal pattern 145 of each of the wiring structures 155 may be covered by the barrier pattern 135 except for the central portion of the top surface thereof, and particularly, the portion of the metal pattern 145 at which the top surface and the sidewall thereof face each other may be covered by the barrier pattern 135 well. Thus, when a voltage is applied to the metal pattern 145, the electric field may not concentrate on a specific portion thereof, and the deterioration of the reliability of the semiconductor device due to the migration of metal included in the metal pattern 145 may be prevented.

FIGS. 2 to 8 are cross-sectional views illustrating stages of methods of manufacturing a semiconductor device in accordance with some example embodiments. Such methods may be used for manufacturing the semiconductor device shown in FIG. 1A, however, may not be limited thereto. For example, the semiconductor device shown in FIG. 1B may be easily manufactured by forming three trenches instead of two trenches in such methods.

Figure 2:
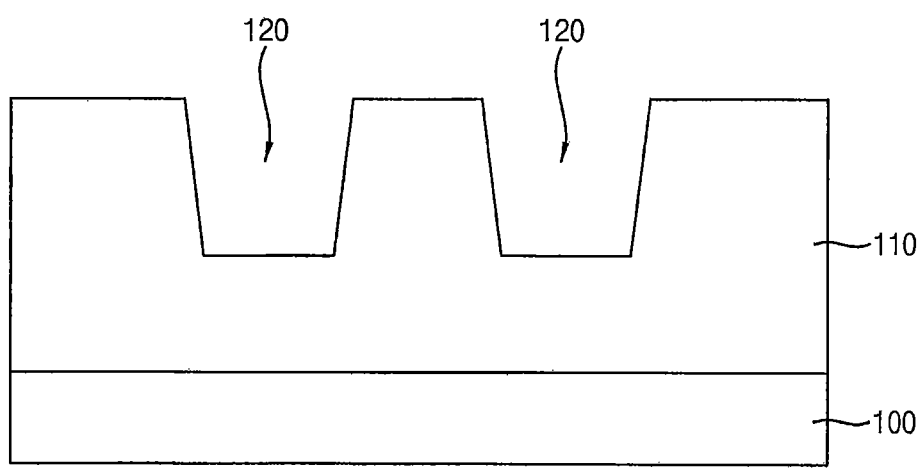

Referring to FIG. 2, a first insulating interlayer 110 may be formed on a substrate 100, and trenches 120 may be formed in the first insulating interlayer 110.

The substrate 100 may include a semiconductor material, e.g., silicon, germanium, silicon-germanium, etc., or III-V semiconductor compounds, e.g., GaP, GaAs, GaSb, etc. In some example embodiments, the substrate 100 may be an SOI substrate and/or a GOI substrate.

The first insulating interlayer 110 may be formed of a low-k dielectric material, e.g., silicon oxide doped with carbon (SiCOH) and/or silicon oxide doped with fluorine (F—$SiO_2$), a porous silicon oxide, spin on organic polymer, and/or an inorganic polymer, e.g., hydrogen silsesquioxane (HSSQ), methyl silsesquioxane (MSSQ), etc.

The trenches 120 may be formed by a photolithography process using a photoresist pattern (not shown). As illustrated above, FIG. 2 shows that two trenches are formed, however, the inventive concepts may not be limited thereto, and a plurality of trenches more than two may be formed. Hereinafter, only the case in which the two trenches are formed will be illustrated.

Figure 3:
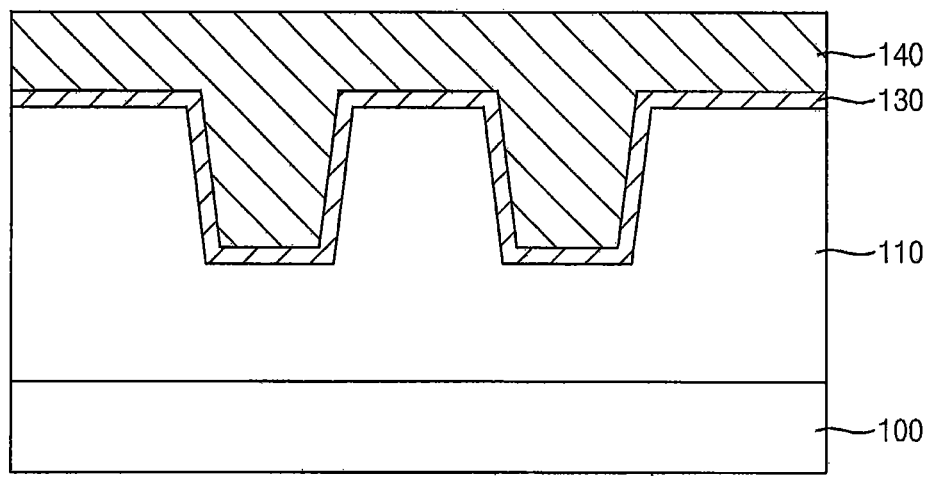

Referring to FIG. 3, a barrier layer 130 may be formed on inner walls of the trenches 120 and a top surface of the first insulating interlayer 110, and a metal layer 140 may be formed on the barrier layer 130 to sufficiently fill remaining portions of the trenches 120.

The barrier layer 130 may be formed of a metal nitride, e.g., tantalum nitride, titanium nitride, etc., and/or a metal, e.g., tantalum, titanium, etc. The metal layer 140 may be formed of a metal, e.g., copper, aluminum, tungsten, etc.

In some example embodiments, the barrier layer 130 may be formed by a chemical vapor deposition (CVD) process, an atomic layer deposition (ALD) process, a physical vapor deposition (PVD) process, etc. Thus, the barrier layer 130 may be conformally formed on the inner walls of the trenches 120 and the top surface of the first insulating interlayer 110. The metal layer 140 may be formed by forming a seed layer (not shown) on the barrier layer 130, and performing an electroplating process.

Before the metal layer 140 is formed, a liner (not shown) may be further formed on the barrier layer 130. The liner may be formed of a metal, e.g., cobalt, ruthenium, etc.

Figure 4:
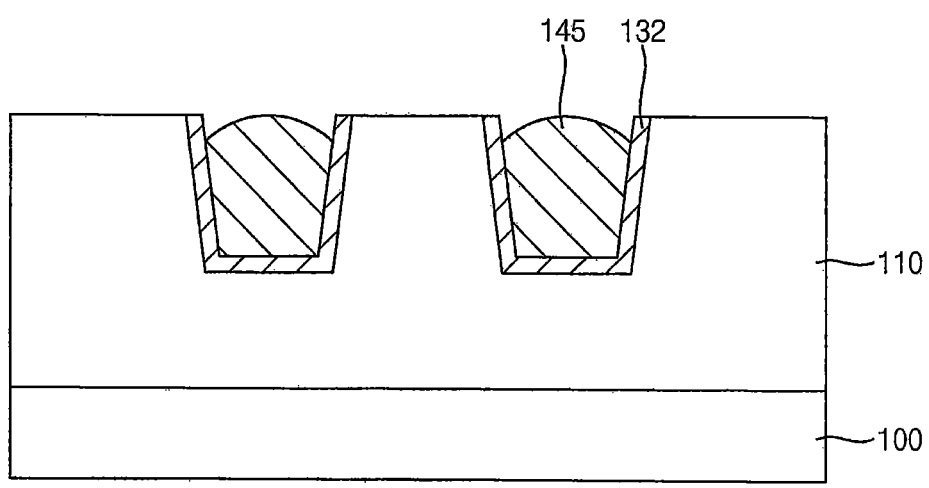

Referring to FIG. 4, the metal layer 140 and the barrier layer 130 may be planarized until the top surface of the first insulating interlayer 110 may be exposed to form a metal pattern 145 and a preliminary barrier pattern 132, respectively, in each trench 120.

In some example embodiments, the planarization process may be performed by a chemical mechanical polishing (CMP) process and/or an etch back process.

A top surface of the metal pattern 145 may have a curved shape in which a central portion is higher than an edge portion. That is, the central portion of the top surface of the metal pattern 145 may be substantially coplanar with the top surface of the first insulating interlayer 110, while the edge portion of the top surface of the metal pattern 145 may be lower than the top surface of the first insulating interlayer 110. A top surface of an uppermost portion of the preliminary barrier pattern 132 may be substantially coplanar with the top surface of the first insulating interlayer 110, and the preliminary barrier pattern 132 may be conformally formed on a bottom and a sidewall of each trench 120.

Thus, a bottom surface and a sidewall of the metal pattern 145 may be directly covered by the preliminary barrier pattern 132, while the top surface of the metal pattern 145 may not be covered by the preliminary barrier pattern 132.

Figure 5:
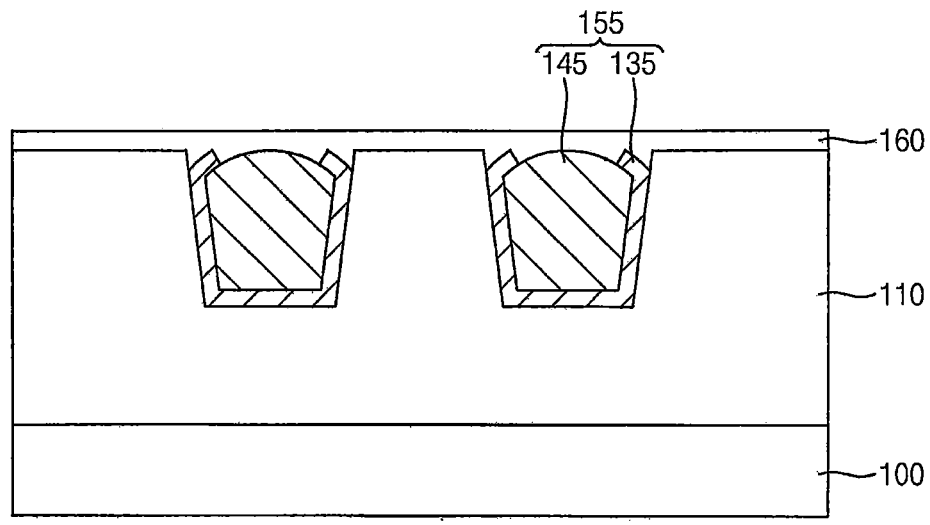

Referring to FIG. 5, a first diffusion barrier layer 160 may be formed on the metal pattern 145, the preliminary barrier pattern 132 and the first insulating interlayer 110.

In some example embodiments, the first diffusion barrier layer 160 may be formed by a CVD process, an ALD process or a PVD process, and the uppermost portion of the preliminary barrier pattern 132 may be bent toward the top surface of the metal pattern 145 due to the heat generated by the process to directly contact the top surface of the metal pattern 145. Thus, the preliminary barrier pattern 132 may be transformed into a barrier pattern 135, which may cover an edge portion of the top surface of the metal pattern 145.

The barrier pattern 135 and the metal pattern 145 may form a wiring structure 155, and the bottom surface, the sidewall, and the edge portion of the top surface of the metal pattern 145 may be covered by the barrier pattern 135.

The first diffusion barrier layer 160 may be formed of a nitride, e.g., silicon nitride, silicon carbonitride, silicon carboxide, silicon oxycarbonitride, etc.

Figure 6:
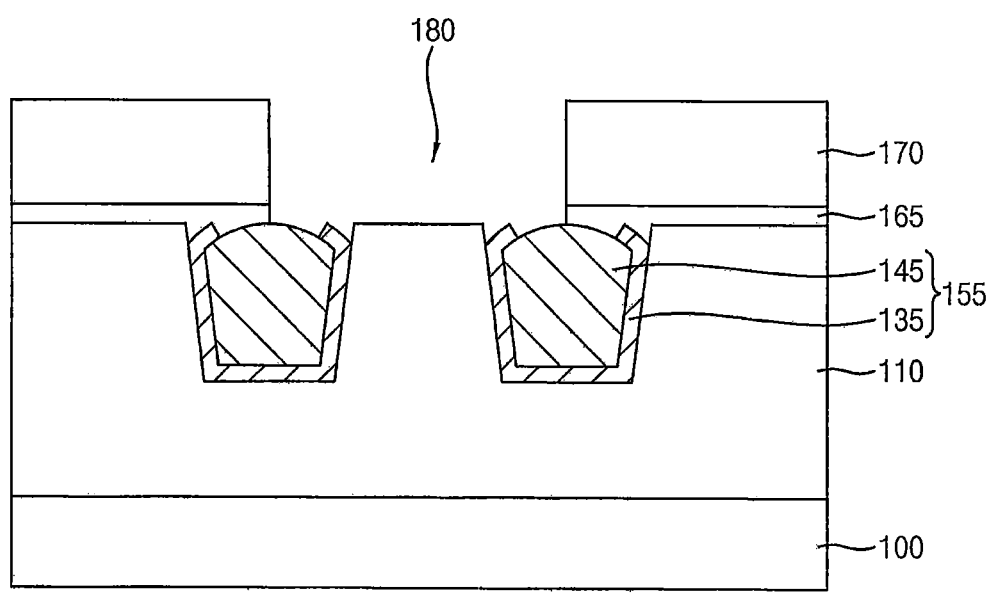

Referring to FIG. 6, an etching mask 170 may be formed on the first diffusion barrier layer 160, and the underlying first diffusion barrier layer 160 may be etched using the etching mask 170 to form a first diffusion barrier pattern 165, and a portion of the first insulating interlayer 110 between the wiring structures 155 may be exposed.

In some example embodiments, the etching mask 170 may include a first opening 180 overlapping the portion of the first insulating interlayer 110 between the wiring structures 155. The first opening 180 may also overlap a portion or the whole portion of a top surface of each of the wiring structures 155. That is, the etching mask 155 may be formed so that the portion of the first insulating interlayer 110 between the wiring structures 155 may be removed to form a recess 190 (refer to FIG. 7) for forming an air gap 230 (refer to FIG. 1), and the first opening 180 in the etching mask 170 may overlap only the portion of the first insulating interlayer 110 between the wiring structures 155. However, the wiring structures 155 may include a material having a high etching selectivity with respect to that of the first insulating interlayer 110, and thus may not be removed during the process for forming the recess even if the wiring structures 155 are not covered by the etching mask 170. Accordingly, the first opening 180 may be formed to overlap not only the portion of the first insulating interlayer 110 between the wiring structures 155 but also the wiring structures 155 adjacent thereto.

In consideration of the mis-alignment during the process for forming the etching mask 170, some embodiments may provide that the first opening 180 overlaps an inner edge portion of the top surface of each of the wiring structures 155.

By the etching process, a portion of the first diffusion barrier layer 160 on the portion of the first insulating interlayer 110 between the wiring structures 155 may be removed, and a first diffusion barrier pattern 165 may remain. The first diffusion barrier pattern 165 may be formed on portions of the first insulating interlayer 110 outside the wiring structures 155, and may be further formed on a portion or the whole portion of the top surface of each of the wiring structures 155.

Figure 7:
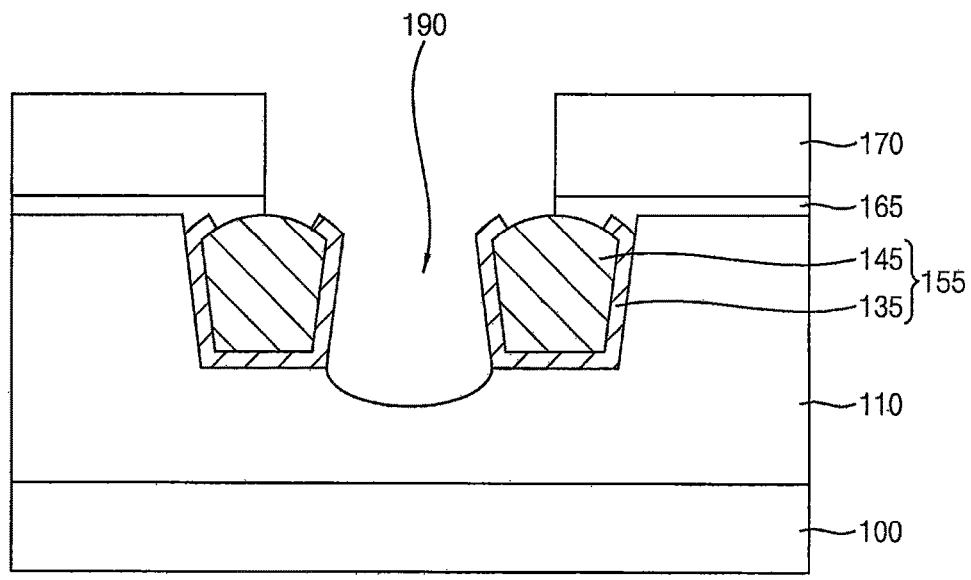

Referring to FIG. 7, the exposed portion of the first insulating interlayer 110 between the wiring structures 155 may be removed to form the recess 190 exposing sidewalls of the wiring structures 155.

In some example embodiments, the formation of the recess 190 may be performed by a remote plasma etching process. That is, the etching process may be performed not by a direct plasma method but by a remote plasma method, and thus fluorine radicals having a relatively weak directionality rather than fluorine ions having a relatively strong directionality may be mainly used in the etching process. Accordingly, in the etching process of the first insulating interlayer 110, the neighboring barrier pattern 135, particularly, an upper portion of the barrier pattern 135 may not be etched, and thus the upper edge portion of the top surface of the metal pattern 145 covered by the barrier pattern 135 may not be exposed.

In some example embodiments, the recess 190 may be formed to have a bottom lower than bottom surfaces of the wiring structures 155, however, the inventive concepts may not be limited thereto. In some embodiments, the bottom of the recess 190 may not vertically overlap the bottom surfaces of the wiring structures 155.

Figure 8:
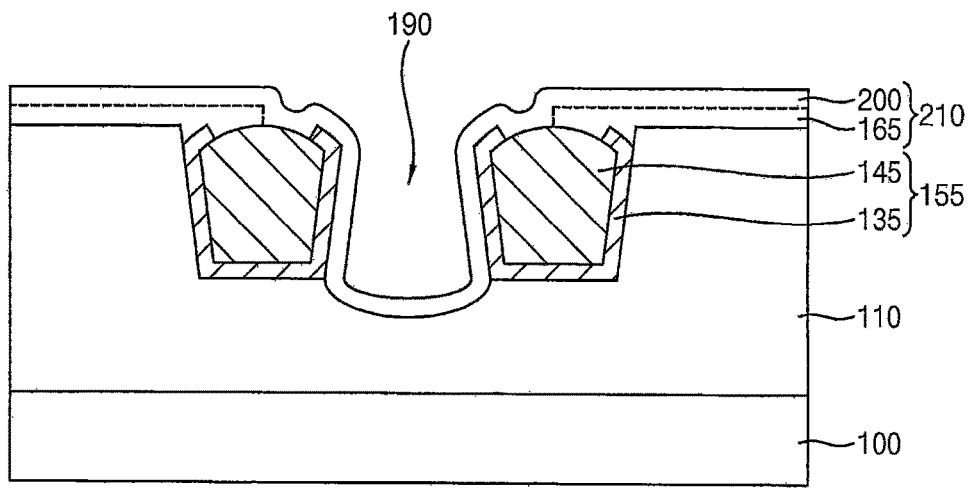

Referring to FIG. 8, after removing the etching mask 170, a second diffusion barrier layer 200 may be formed on an inner wall of the recess 190, sidewalls and top surfaces of the exposed wiring structures 155, and a top surface of the first diffusion barrier pattern 165, and the first diffusion barrier pattern 165 and the second diffusion barrier layer 200 may form a diffusion barrier structure 210.

In some example embodiments, the second diffusion barrier layer 200 may be conformally formed by a CVD process, an ALD process or a PVD process to have a constant thickness. For example, the second diffusion barrier layer 200 may be formed of a nitride, e.g., silicon nitride, silicon carbonitride, silicon carboxide, silicon oxycarbonitride, etc.

Thus, when the second diffusion barrier layer 200 is formed of a material substantially the same as that of the first diffusion barrier pattern 165, they may be merged with each other to form a single layer. As a result, in the diffusion barrier structure 210 having the single layer, a first portion, which may be formed on the top surface of the first insulating interlayer 110 outside the wiring structures 155 and/or the edge portion of the top surface of each of the wiring structures 155 adjacent thereto, may have a first thickness greater than a second thickness of a second portion, which may be formed on remaining portions of the top surfaces and inner sidewalls of the wiring structures 155.

Referring to FIG. 1A again, a second insulating interlayer 220 may be formed on the diffusion barrier structure 210 under conditions having low gap filling characteristics to form the air gap 230 between the second insulating interlayer 220 and the diffusion barrier structure 210.

The second insulating interlayer 220 may be formed of a low-k dielectric material, e.g., silicon oxide doped with carbon (SiCOH) and/or silicon oxide doped with fluorine (F—SiO$_2$), a porous silicon oxide, spin on organic polymer, and/or an inorganic polymer, e.g., hydrogen silsesquioxane (HSSQ), methyl silsesquioxane (MSSQ), etc. In some example embodiments, the second insulating interlayer 220 may be formed of a material substantially the same as that of the first insulating interlayer 110.

A top of the air gap 230 may be defined by the second insulating interlayer 220, and a sidewall and a bottom of the air gap 230 may be defined by the diffusion barrier structure 210, i.e., the second diffusion barrier layer 200.

In some example embodiments, the air gap 230 may be formed to have a rounded triangular shape in which a width of a lower portion is greater than a width of an upper portion. However, the inventive concepts may not be limited thereto. The top of the air gap 230 may be higher than the top surfaces of the wiring structures 155, and the bottom of the air gap 230 may be lower than the bottom surfaces of the wiring structures 155, however, the inventive concepts may not be limited thereto.

The semiconductor device shown in FIG. 1A may be manufactured by the above processes.

Figure 9:
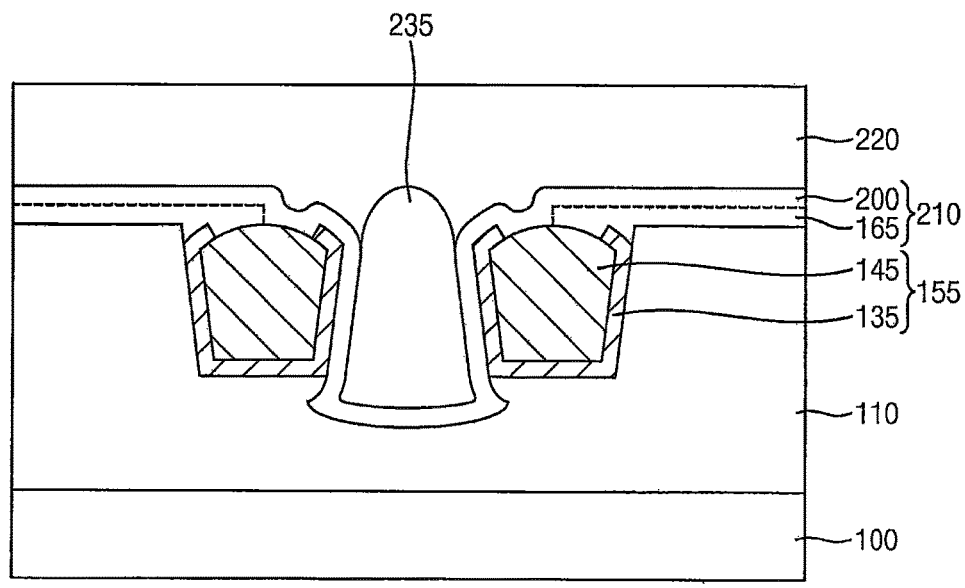

FIG. 9 is a cross-sectional view illustrating a semiconductor device in accordance with some example embodiments. The semiconductor device may be substantially the same as or similar to that of FIG. 1A, except for the shapes of the diffusion barrier structure and the air gap. Thus, like reference numerals refer to like elements, and detailed descriptions thereon are omitted herein.

Referring to FIG. 9, the semiconductor device may include the insulating interlayer structure and the wiring structures 155 on the substrate 100. The semiconductor device may further include the diffusion barrier structure 210.

The diffusion barrier structure 210 may include the first diffusion barrier pattern 165 and the second diffusion barrier layer 200. A lower portion of the second diffusion barrier layer 200 between the wiring structures 155 may protrude toward the bottom surface of each of the wiring structures 155.

Thus, a lower sidewall and a bottom of an air gap 235 defined by the second diffusion barrier layer 200 may also protrude toward the bottom surface of each of the wiring structures 155.

Figure 10:
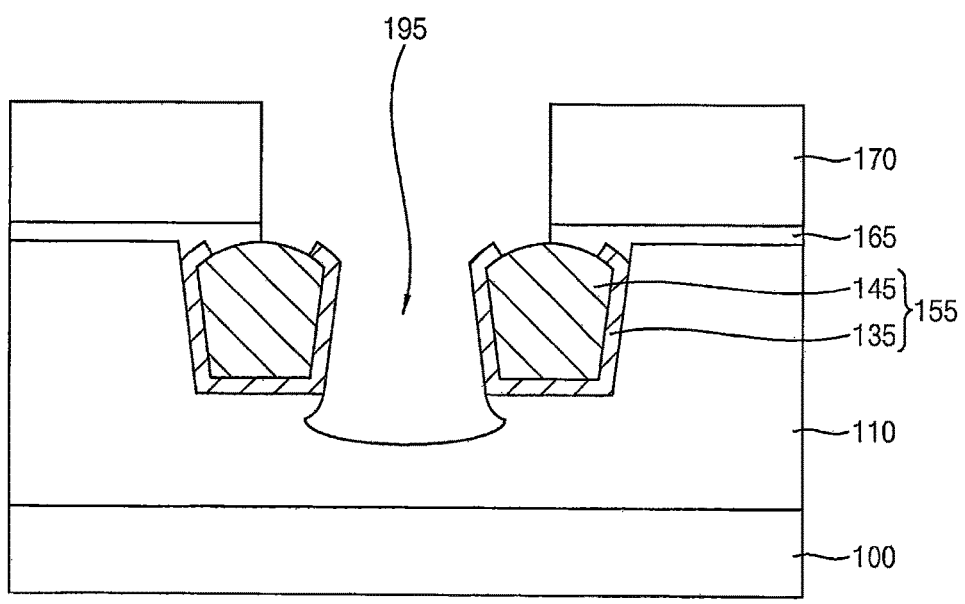

FIG. 10 is a cross-sectional view illustrating a stage of a method of manufacturing a semiconductor device in accordance with example embodiments. This method may include processes substantially the same as or similar to those illustrated with reference to FIGS. 2 to 8 and FIG. 1, and thus detailed descriptions thereon are omitted herein.

First, processes substantially the same as or similar to those illustrated with reference to FIGS. 2 to 6 may be performed.

Referring to FIG. 10, the exposed portion of the first insulating interlayer 110 between the wiring structures 155 may be removed to form a recess 195 exposing sidewalls of the wiring structures 155.

In some example embodiments, the formation of the recess 195 may be performed by a wet etching process. The wet etching process may have isotropic etching characteristics, and thus in the etching process of the first insulating interlayer 110, the neighboring barrier pattern 135, particularly, an upper portion of the barrier pattern 135 may not be etched. Thus, an edge portion of the top surface of the metal pattern 145 may not be exposed.

In some example embodiments, the recess 195 may be formed to have a bottom lower than the bottom surfaces of the wiring structures 155, and further the bottom of the recess 195 may be formed to protrude toward the bottom surface of each of the wiring structures 155. The bottom of the recess 195 may be vertically overlapped with the bottom surface of each of the wiring structures 155.

Processes substantially the same as or similar to those illustrated with reference to FIGS. 7 to 8 and FIG. 1 may be performed to complete the semiconductor device.

According to the shape of the recess 195, the second diffusion barrier layer 200 on the inner wall of the recess 195 may be formed to have a bottom protruding toward the bottom surface of each of the wiring structures 155. Additionally, a bottom of the air gap 235 of which the bottom and a sidewall may be defined by the second diffusion barrier layer 200 may also protrude toward the bottom surface of each of the wiring structures 155.

Figure 11:
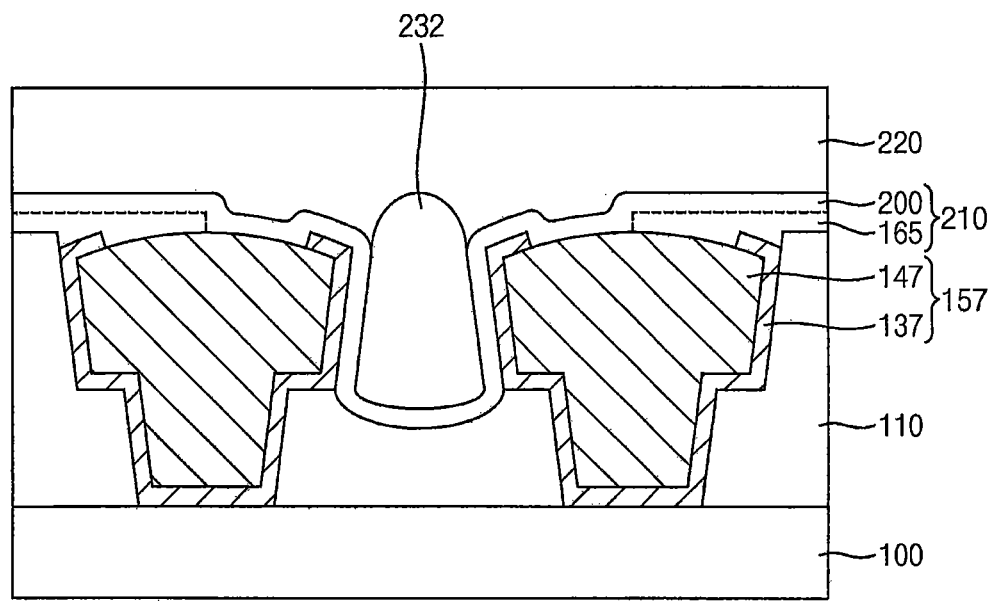

FIG. 11 is a cross-sectional view illustrating a semiconductor device in accordance with some example embodiments. The semiconductor device may be substantially the same as or similar to that of FIG. 1A, except for the shape of the wiring structure. Thus, like reference numerals refer to like elements, and detailed descriptions thereon are omitted herein.

Referring to FIG. 11, the semiconductor device may include the insulating interlayer structure and wiring structures 157 on the substrate 100. The semiconductor device may further include the diffusion barrier structure 210.

Each of the wiring structures 157 may include a metal pattern 147, and a barrier pattern 137 covering a bottom surface, a sidewall, and an edge portion of a top surface of the metal pattern 147. The barrier pattern 137 may not cover a central portion of the top surface of the metal pattern 147.

The metal pattern 147 may include a lower portion and an upper portion integrally formed with the lower portion. A width of the upper portion of the metal pattern 147 may be greater than a width of the lower portion thereof. Thus, a width of an upper portion of each of the wiring structures 157 may be greater than a width of a lower portion thereof.

In some example embodiments, a bottom of the air gap 232 may be lower than a bottom surface of the upper portion of each of the wiring structures 157 and higher than a bottom surface of the lower portion of each of the wiring structures 157. However, the inventive concepts may not be limited thereto.

In the semiconductor device, the metal pattern 147 of each of the wiring structures 157 may be covered by the barrier pattern 137, except for the central portion of the top surface of the metal pattern 147. Particularly, an area of the metal pattern 147 at which the sidewall and the top surface may meet or contact with each other may be covered by the barrier pattern 137 well. Thus, when a voltage is applied to the metal pattern 147, the electric field may not concentrate on a specific portion of the metal pattern 147. Accordingly, the deterioration of the reliability of the semiconductor device due to the migration of metal included in the metal pattern 147 may be prevented.

Figure 12:
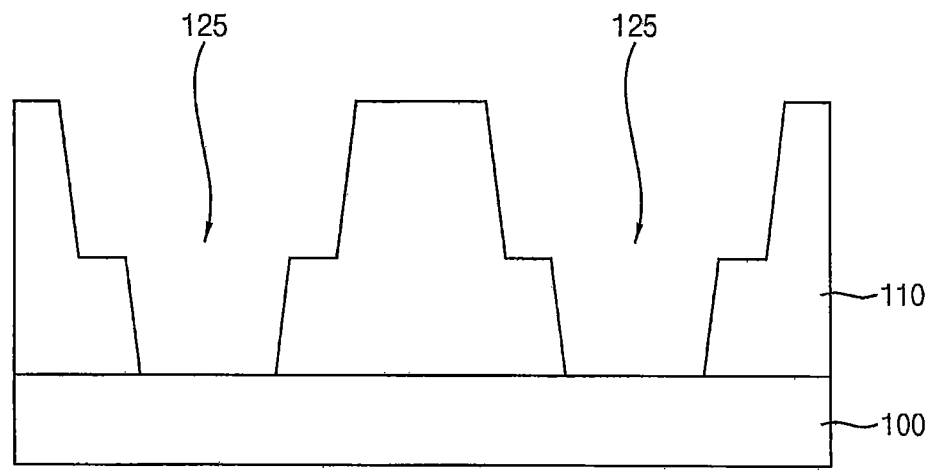
Figure 13:
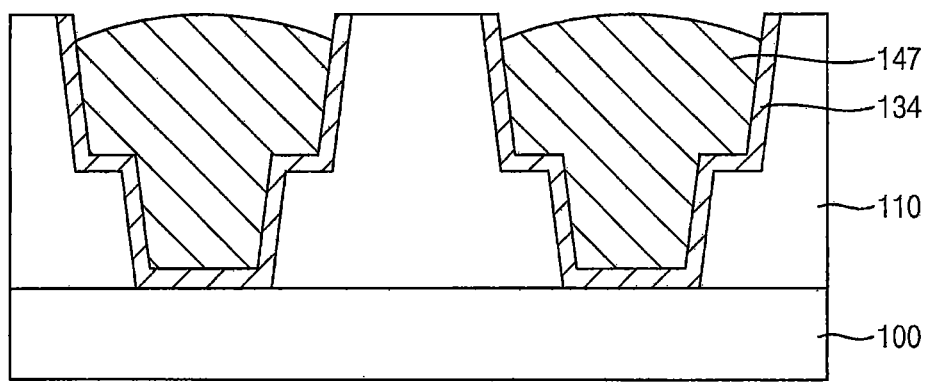
Figure 14:
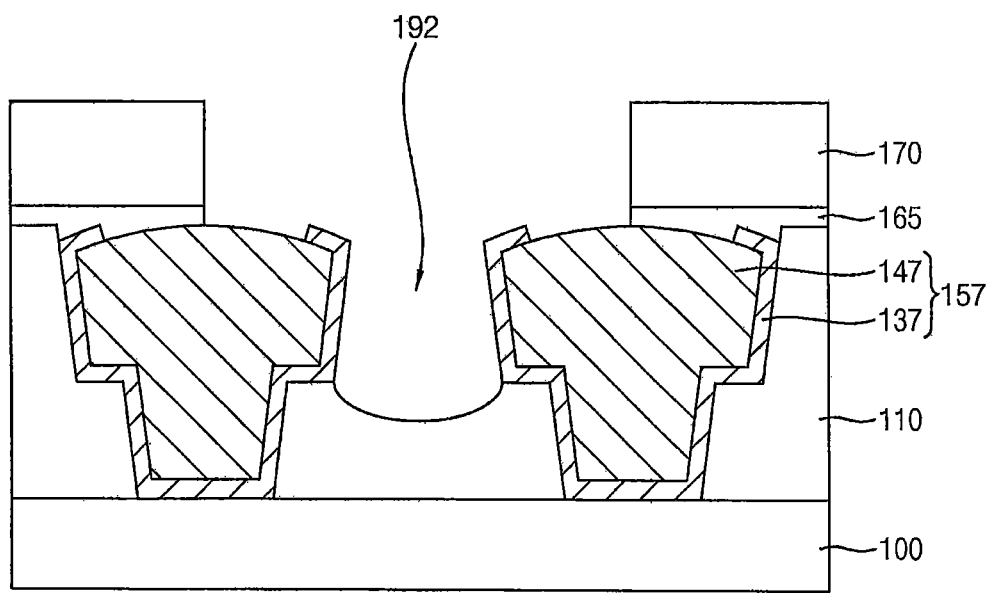

FIGS. 12 to 14 are cross-sectional views illustrating stages of methods of manufacturing a semiconductor device in accordance with some example embodiments. Such methods may include processes substantially the same as or similar to those illustrated with reference to FIGS. 2 to 8 and FIG. 1, and thus detailed descriptions thereon are omitted herein.

Referring to FIG. 12, a process substantially the same as or similar to that illustrated with reference to FIG. 2 may be performed to form trenches, and via holes exposing top surfaces of the substrate 100 may be formed to be in communication with trenches, respectively. Each trench and the corresponding via hole may form a second opening 125.

In some example embodiments, each of the via holes may be formed to have a width smaller than a width of the corresponding one of the trenches.

Some embodiments provide that, after forming the via holes to expose top surfaces of the substrate 100, the trenches each having a width greater than a width of the corresponding via hole may be formed to be in communication therewith.

Referring to FIG. 13, processes substantially the same as or similar to those illustrated with reference to FIGS. 3 and 4 may be performed.

Accordingly, a preliminary barrier pattern 134 and a metal pattern 147 may be formed in each of the second openings 125. According to the shape of each second opening 125, the metal pattern 147 may be formed to have an upper portion having a relatively wide with and a lower portion having a narrow width relative to the width of the upper portion.

Referring to FIG. 14, processes substantially the same as or similar to those illustrated with reference to FIGS. 5 to 7 may be performed.

Thus, wiring structures 157 each including a barrier pattern 137 and the metal pattern 147 may be formed, and a first diffusion barrier pattern 165 may be formed on a top surface of the first insulating interlayer 110 and a portion of a top surface of each of the wiring structures 157. A remote plasma etching process may be performed on a portion of the first insulating interlayer 110 between the wiring structures 157 to form a recess 192.

Referring to FIG. 11 again, processes substantially the same as or similar to those illustrated with reference to FIGS. 8 and 1 may be performed to complete the semiconductor device.

Figure 15:
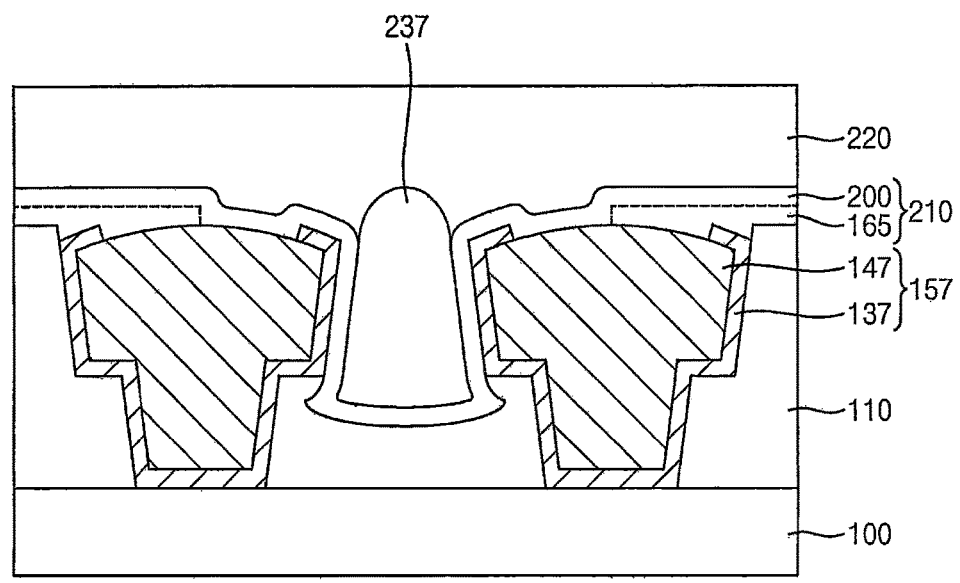

FIG. 15 is a cross-sectional view illustrating a semiconductor device in accordance with some example embodiments. The semiconductor device may be substantially the same as or similar to that of FIG. 1A, except for the shapes of the diffusion barrier structure and the air gap. Thus, like reference numerals refer to like elements, and detailed descriptions thereon are omitted herein.

Referring to FIG. 15, the semiconductor device may include the insulating interlayer structure and wiring structures 157 on the substrate 100. The semiconductor device may further include the diffusion barrier structure 210.

Each of the wiring structures 157 may include an upper portion having a relatively wide width and a lower portion having a narrow width relative to the width of the upper portion.

The diffusion barrier structure 210 may include the first diffusion barrier pattern 165 and the second diffusion barrier layer 200. A lower portion of the second diffusion barrier layer 200 between the wiring structures 157 may protrude toward a bottom surface of the upper portion of each of the wiring structures 157.

Thus, a lower sidewall and a bottom of the air gap 237 of which the bottom and a sidewall may be defined by the second diffusion barrier layer 200 may also protrude toward the bottom surface of the upper portion of each of the wiring structures 157.

Figure 16:
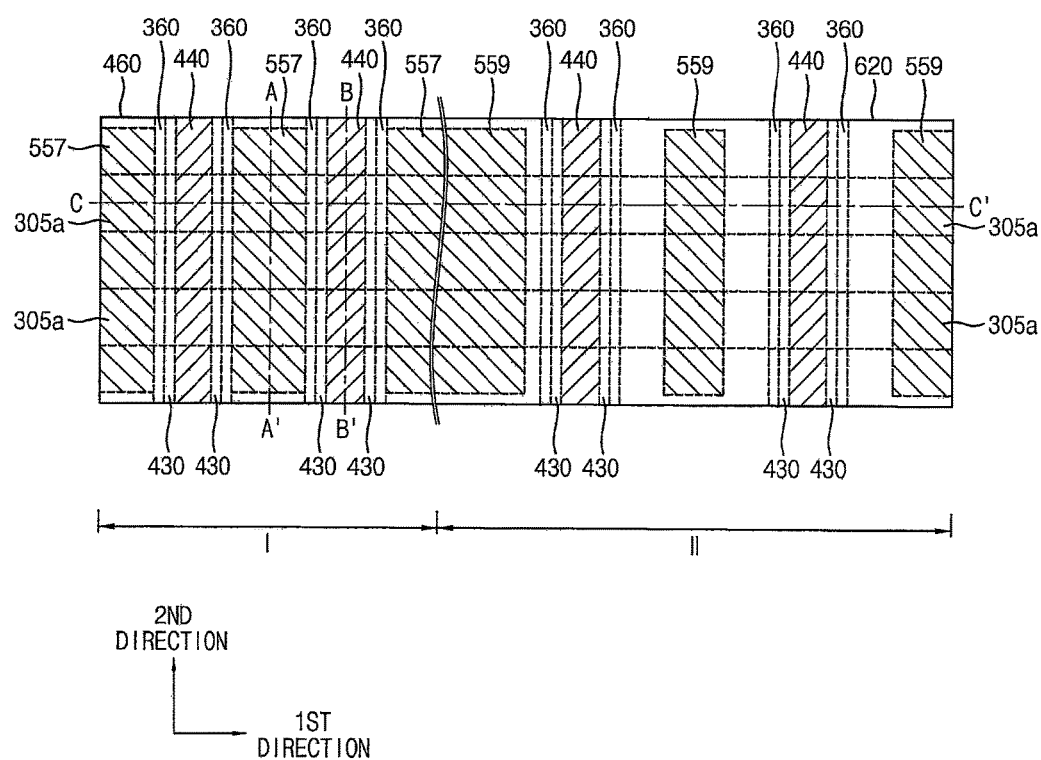
Figure 17:
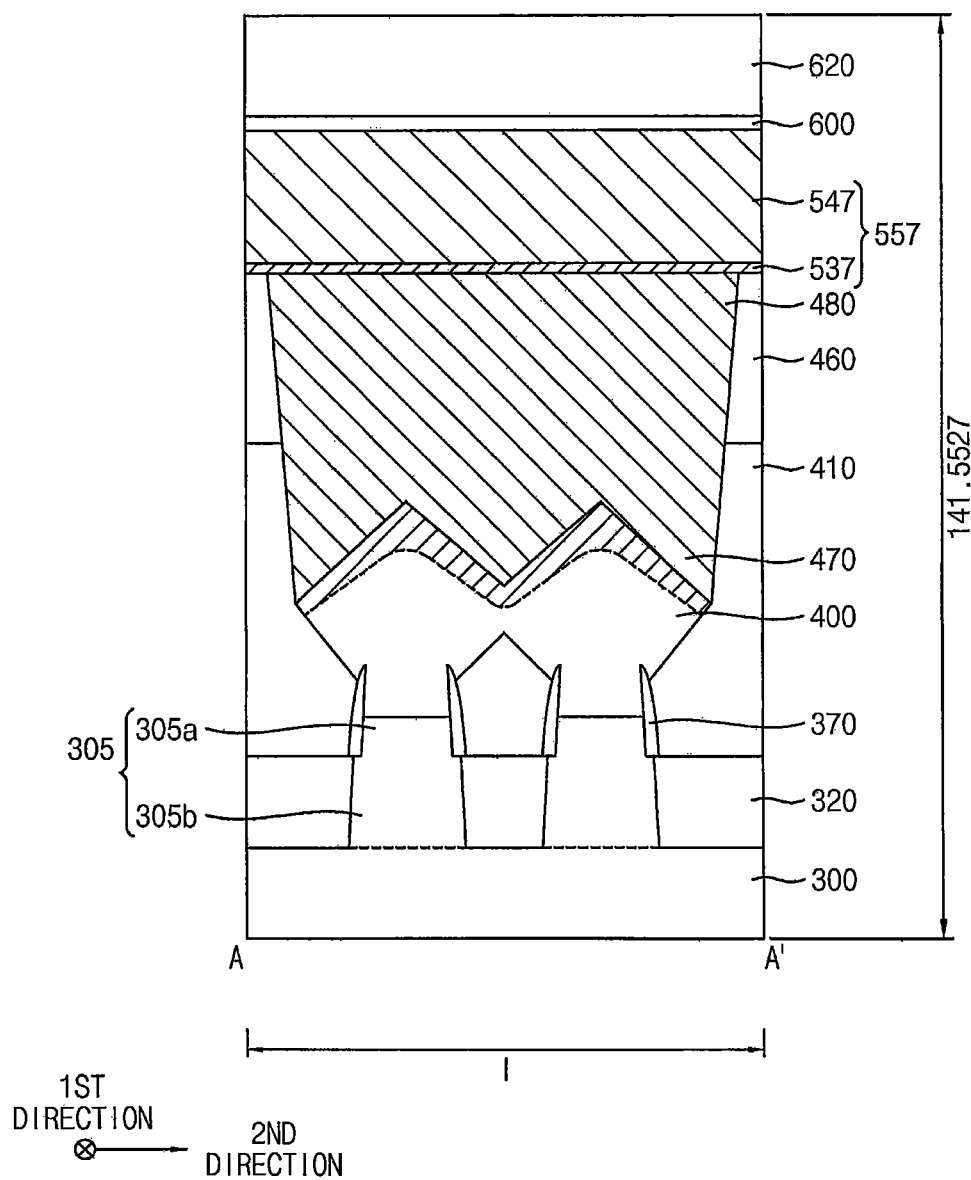
Figure 18:
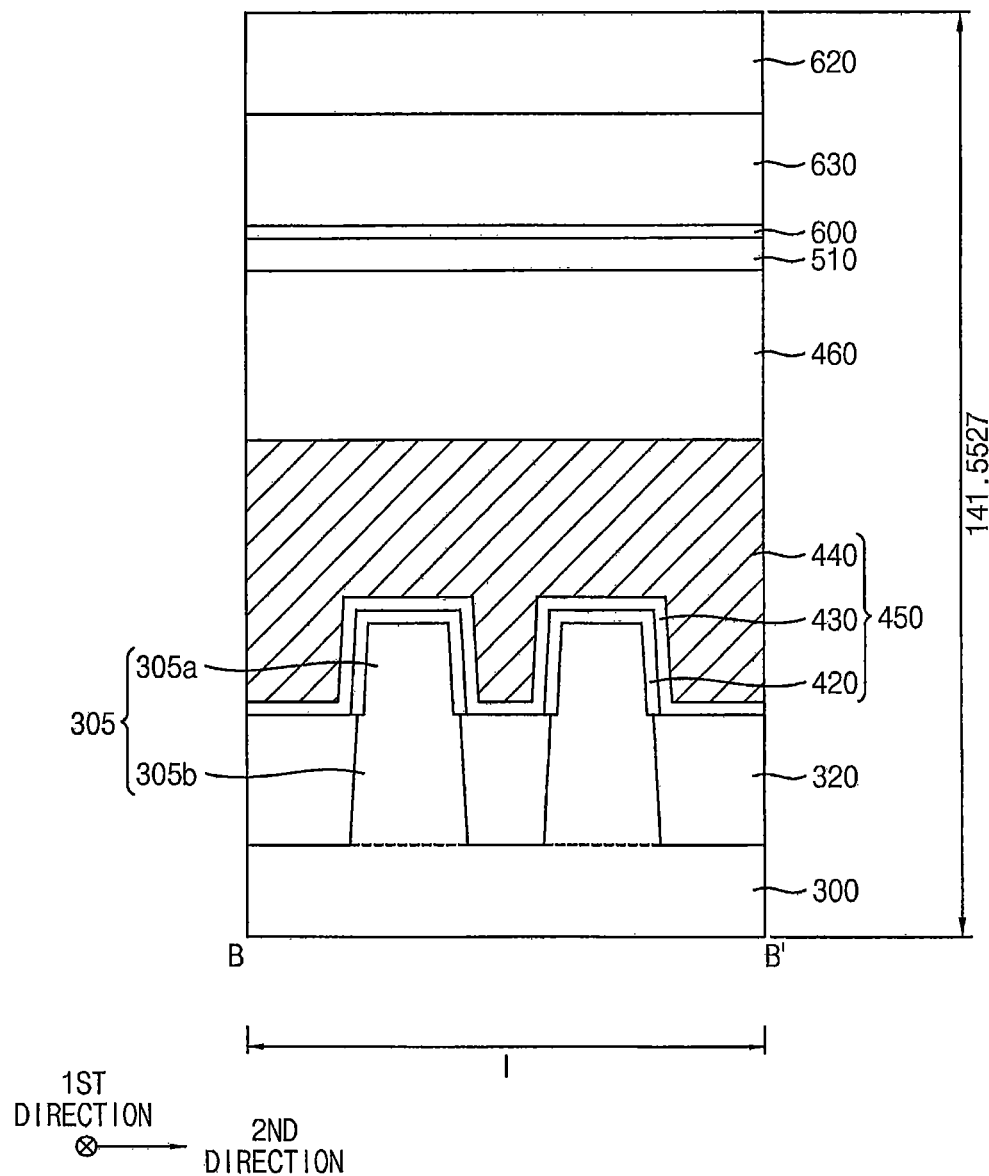
Figure 19:
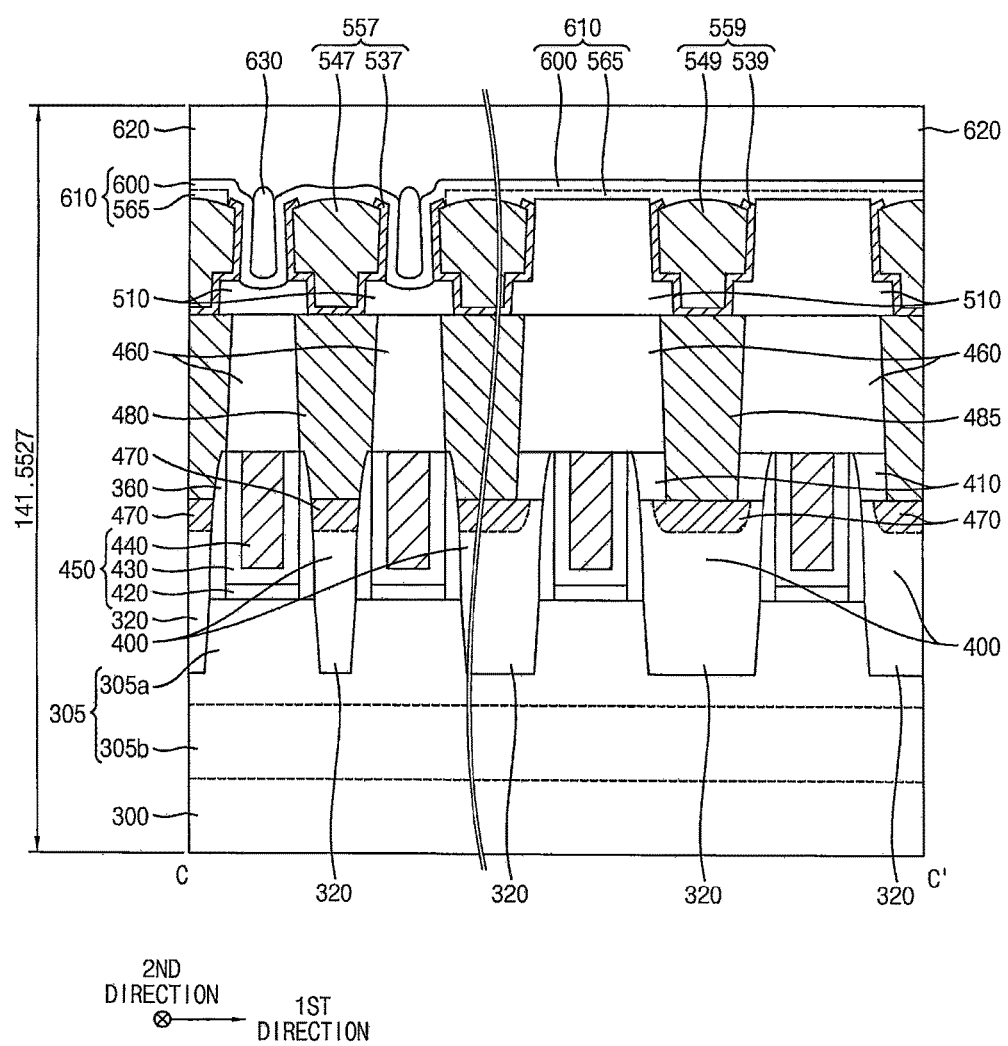

FIGS. 16 to 19 are a plan view and cross-sectional views illustrating a semiconductor device in accordance with some example embodiments. Particularly, FIG. 16 is a plan view of the semiconductor device, and FIGS. 17 to 19 are cross-sectional views of the semiconductor device. FIG. 17 is a cross-sectional view taken along a line A-A' of FIG. 16, FIG. 18 is a cross-sectional view taken along a line B-B' of FIG. 16, and FIG. 19 is a cross-sectional view taken along a line C-C' of FIG. 16.

Referring to FIGS. 16 to 19, the semiconductor device may include a transistor, an insulating interlayer structure, first and second wiring structures 557 and 559, and a diffusion barrier structure 610 on the substrate 300. The semiconductor device may further include a metal silicide pattern 470, and first and second contact plugs 480 and 485.

The substrate 300 may include a semiconductor material, e.g., silicon, germanium, silicon-germanium, etc., or III-V semiconductor compounds, e.g., GaP, GaAs, GaSb, etc. In some example embodiments, the substrate 300 may be an SOI substrate and/or a GOI substrate.

The substrate 300 may include first and second regions I and II. The first region I may be a region in which the first wiring structures 557 disposed at a relatively short distance from each other may be formed, and the second region II may be a region in which the second wiring structures 559 disposed at a relatively wide distance from each other may be formed.

An isolation pattern 320 may be formed on the substrate 300, and thus a field region having a top surface covered by the isolation pattern 320 and an active region having a top surface not covered by the isolation pattern 320 may be defined in the substrate 300. The active region may have a fin-like shape protruding from the substrate 300, and thus may be referred to as an active fin 305. The isolation pattern 320 may include an oxide, e.g., silicon oxide.

In some example embodiments, the active fin 305 may extend in a first direction substantially parallel to a top surface of the substrate 300, and a plurality of active fins 305 may be disposed in a second direction substantially parallel to the top surface of the substrate 300 and substantially perpendicular to the first direction. In some example embodiments, the active fin 305 may include a lower active pattern 305b of which a sidewall may be covered by the isolation pattern 320, and an upper active pattern 305a protruding above a top surface of the isolation pattern 320. In some example embodiments, the upper active pattern 305a may have a width in the second direction slightly smaller than a width of the lower active pattern 305b in the second direction.

Fin spacers 370 may be further formed on sidewalls of the active fin 305 opposed to each other in the second direction. The fin spacers 370 may include a nitride, e.g., silicon nitride.

The transistor may include a gate structure 450 and a source/drain layer 400 on the substrate 300.

In some example embodiments, the gate structure 450 may extend in the second direction on the active fins 305 of the substrate 300 and the isolation pattern 320, and a plurality of gate structures 450 may be formed in the first direction. The gate structures 450 in the first region I may be disposed at a distance from each other smaller than a distance between the gate structures 450 disposed in the second direction II.

The gate structure 450 may include an interface pattern 420, a gate insulation pattern 430 and a gate electrode 440 sequentially stacked. Gate spacers 360 may be further formed on sidewalls of the gate structure 450 opposed to each other in the first direction. The interface pattern 430 may be formed on the active fin 305, the gate insulation pattern 430 may be formed on the interface pattern 420 and inner sidewalls of the gate spacers 360, and the gate electrode 440 may be formed on the gate insulation pattern 430 between the inner sidewalls of the gate spacers 360. Thus, a bottom and a sidewall of the gate electrode 440 may be covered by the gate insulation pattern 430. In some embodiments, the interface pattern 420 may not be formed.

The interface pattern 420 may include an oxide, e.g., silicon oxide, the gate insulation pattern 430 may include a metal oxide having a high dielectric constant, e.g., hafnium oxide, tantalum oxide, zirconium oxide, or the like, and the gate electrode 440 may include a material having a low resistance, e.g., a metal such as aluminum, copper, tantalum, etc., or a metal nitride thereof. The gate spacer 360 may include a nitride, e.g., silicon nitride, silicon oxycarbonitride, etc.

The source/drain layer 400 may be formed on the active fins 305 at sides of the gate structure 450 opposed to each other in the first direction. The source/drain layer 400 together with the gate structure 450 may form a negative-channel metal oxide semiconductor (NMOS) transistor or a positive-channel metal oxide semiconductor (PMOS) transistor according to the conductivity type of impurities doped thereinto. When the source/drain layer 400 forms the NMOS transistor, the source/drain layer 400 may be a single crystalline silicon carbide layer doped with n-type impurities or a single crystalline silicon layer doped with n-type impurities. When the source/drain layer 400 forms the PMOS transistor, the source/drain layer 400 may be a single crystalline silicon-germanium layer doped with p-type impurities.

The source/drain layer 400 may fill a recess (not shown) between the fin spacers 370 on the sidewalls of the active fin 305 opposed to each other in the second direction, and may contact a portion of the gate spacer 360 at sides of the gate structure 450 opposed to each other in the first direction. A cross-section of the source/drain layer 400 may have a shape of pentagon or hexagon, and when the active fins 305 adjacent each other in the second direction are spaced apart from each other at a small distance, the source/drain layers 400 adjacent each other in the second direction may be connected to each other to form a single layer.

The metal silicide pattern 470 may be formed at upper portions of the source/drain layer 400 contacting the contact plugs 480 and 485. The metal silicide pattern 470 may include a metal silicide, e.g., cobalt silicide, nickel silicide, etc.

The insulating interlayer structure may include first to fourth insulating interlayers 410, 460, 510 and 620 sequentially stacked on the substrate 300.

The first insulating interlayer 410 may be formed on the substrate 300 and the isolation pattern 320. The first insulating interlayer 410 may surround the gate structure 450 and the gate spacers 360, and cover the fin spacers 370 and the source/drain layers 400. The first insulating interlayer 410 may include an oxide, e.g., silicon oxide.

The second insulating interlayer 460 may be formed on the first insulating interlayer 410, the gate structure 450 and the gate spacers 360, and may include an oxide, e.g., silicon oxide. The second insulating interlayer 460 may include a material substantially the same as or different from that of the first insulating interlayer 410.

Each of the first and second contact plugs 480 and 485 may penetrate through the first and second insulating interlayers 410 and 460, and contact top surfaces of the source/drain layers 400. The first and second contact plugs 480 and 485 may contact the top surfaces of the source/drain layers 400 in the first and second regions I and II, respectively. In some example embodiments, each of the first contact plugs 480 may be self-aligned with the gate spacers 360 on the sidewalls of the gate structure 450, and each of the second contact plugs 485 may not be self-aligned with the gate spacers 360. However, the inventive concepts may not be limited thereto. The first contact plugs 480 may be disposed in the first region I at a distance from each other smaller than a distance between the second contact plugs 485 disposed in the second region II.

The first and second contact plugs 480 and 485 may include a metal, a metal nitride, and/or doped polysilicon.

The third insulating interlayer 510 may be formed on the second insulating interlayer 460, and the first and second contact plugs 480 and 485. The third insulating interlayer 510 may include a low-k dielectric material, e.g., silicon oxide doped with carbon (SiCOH) and/or silicon oxide doped with fluorine (F—SiO$_2$), a porous silicon oxide, spin on organic polymer, and/or an inorganic polymer, e.g., hydrogen silsesquioxane (HSSQ), methyl silsesquioxane (MSSQ), etc.

The first and second wiring structures 557 and 559 may penetrate through the third insulating interlayer 510, and contact the first and second contact plugs 480 and 485, respectively. In some example embodiments, the first wirings 557 may be spaced apart from each other in the first direction in the first region I at a distance smaller than a distance between the second wirings 559 spaced apart from each other in the first direction in the second region II.

The first wiring structure 557 may include a first metal pattern 547, and a first barrier pattern 537 covering a bottom surface, a sidewall, and an edge portion of a top surface of the first metal pattern 557 but not covering a central portion of the top surface of the first metal pattern 557. The second wiring structure 559 may include a second metal pattern 549, and a second barrier pattern 539 covering a bottom surface, a sidewall, and an edge portion of a top surface of the second metal pattern 559 but not covering a central portion of the top surface of the second metal pattern 559. Each of the first and second metal patterns 547 and 549 may include a lower portion having a relatively narrow width and an upper portion having a relatively wide width.

The diffusion barrier structure 610 may be formed on a top surface and both sidewalls of each of the first wiring structures 557, a top surface of each of the second wiring structures 559, and a top surface of the third insulating interlayer 510. In some example embodiments, the diffusion barrier structure 610 may include a first diffusion barrier pattern 565 and a second diffusion barrier layer 600.

The first diffusion barrier pattern 565 may be formed on the top surface of the third insulating interlayer 510, and a portion or the whole portion of top surfaces of outermost ones of the first wiring structures 557 in the first direction in the first region I. The first diffusion barrier pattern 565 may be formed on the top surface of the third insulating interlayer 510, and the top surfaces of the second wiring structures 559 in the second region II. Some embodiments provide that the first diffusion barrier pattern 565 may be formed only on the top surface of the third insulating interlayer 510 and may not be formed on the top surfaces of the outermost ones of the first wiring structures 557 in the first region I.

The second diffusion barrier layer 600 may be formed on a top surface and both sidewalls of each of the first wiring structures 557 in the first region I, but may not be formed on outer sidewalls of the outermost ones of the first wiring structures 557. The second diffusion barrier layer 600 may be formed on the first diffusion barrier pattern 565 in the second direction II.

Each of the first diffusion barrier pattern 565 and the second diffusion barrier layer 600 may include a nitride, e.g., silicon nitride, silicon carbonitride, silicon carboxide, silicon oxycarbonitride, etc. In some example embodiments, the first diffusion barrier pattern 565 and the second diffusion barrier layer 600 may include substantially the same material, and thus may be merged with each other to form a single layer.

The fourth insulating interlayer 620 may be formed on the diffusion barrier structure 610. The fourth insulating interlayer 620 and the diffusion barrier structure 610 may form an air gap 630 between the first wiring structures 557. The air gap 630 may be formed between the first wiring structures 557 that may be spaced apart from each other at a relatively short distance. A top of the air gap 630 may be defined by the fourth insulating interlayer 620, and a sidewall and a bottom of the air gap 630 may be defined by the diffusion barrier structure 610. No air gap may be formed between the second wiring structures 559 that may be spaced apart from each other at a relatively long distance.

The fourth insulating interlayer 620 may include a low-k dielectric material, e.g., silicon oxide doped with carbon (SiCOH) and/or silicon oxide doped with fluorine (F—SiO$_2$), a porous silicon oxide, spin on organic polymer, and/or an inorganic polymer, e.g., hydrogen silsesquioxane (HSSQ), methyl silsesquioxane (MSSQ), etc. The fourth insulating interlayer 620 may include a material substantially the same as or different from that of the third insulating interlayer 510.

Additional insulating interlayers (not shown) including a low-k dielectric material, and additional wiring structures (not shown), which may be formed through the additional insulating interlayers to be electrically connected to the first and second wiring structures 557 and 559, may be further formed on the fourth insulating interlayer 620. FIGS. 16 to 19 show that the semiconductor device includes the wiring structure 157 shown in FIG. 11, however, the inventive concepts may not be limited thereto. The semiconductor device may include the wiring structure 155 shown in FIG. 1.

In the semiconductor device, the first and second wiring structures 557 and 559 may be formed in the third and fourth insulating interlayers 510 and 620 including a low-k dielectric material, and thus the parasitic capacitance may be low. In the first region I, the air gap 630 including air having a dielectric constant of 1 may be formed between the first wiring structures 557 disposed at a relatively short distance, and thus the parasitic capacitance may be lower.

The first and second metal patterns 547 and 549 included in the first and second wiring structures 557 and 559, respectively, may be covered by the first and second barrier patterns 537 and 539, respectively, except for the central portion of the top surface thereof. Particularly, an area at which the sidewall and the top surface of each of the first and second metal patterns 547 and 549 meet or contact each other may be covered by each of the first and second barrier patterns 537 and 539 well. Thus, when a voltage is applied, the electric field may not concentrate on a specific portion thereof, and the deterioration of the reliability of the semiconductor device due to the migration of metal included in the metal patterns 547 and 549 may be prevented.

FIGS. 20 to 46 are plan views and cross-sectional views illustrating stages of methods of manufacturing a semiconductor device in accordance with some example embodiments. Particularly, FIGS. 20, 22, 25, 28, 31, 34, 37, 40 and 43 are plan views, and FIGS. 21, 23-24, 26-27, 29-30, 32-33, 35-36, 38-39, 41-42 and 44-46 are cross-sectional views.

Figure 23:
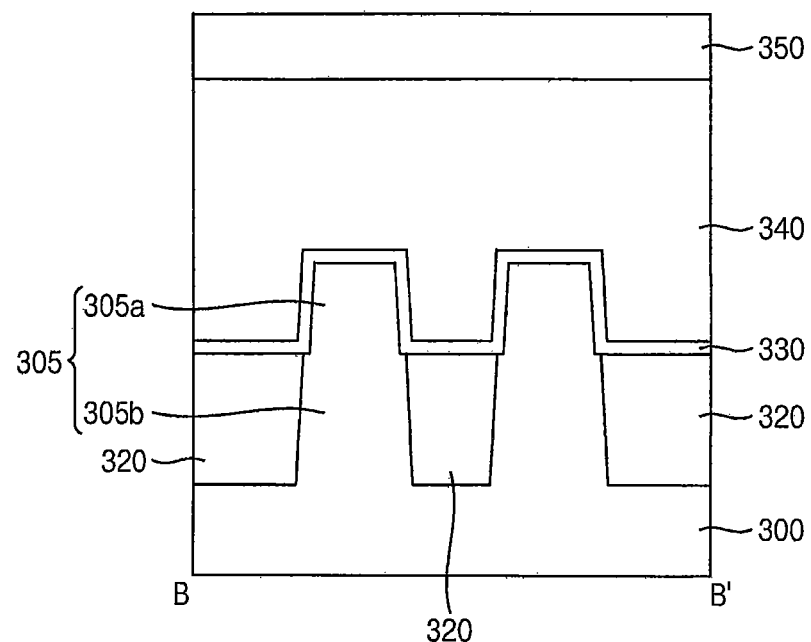
Figure 23:
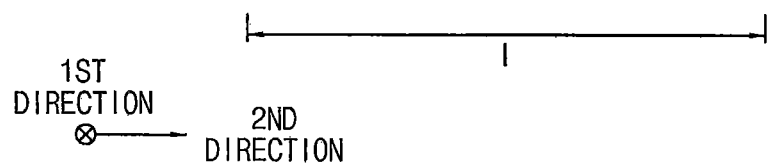
Figure 38:
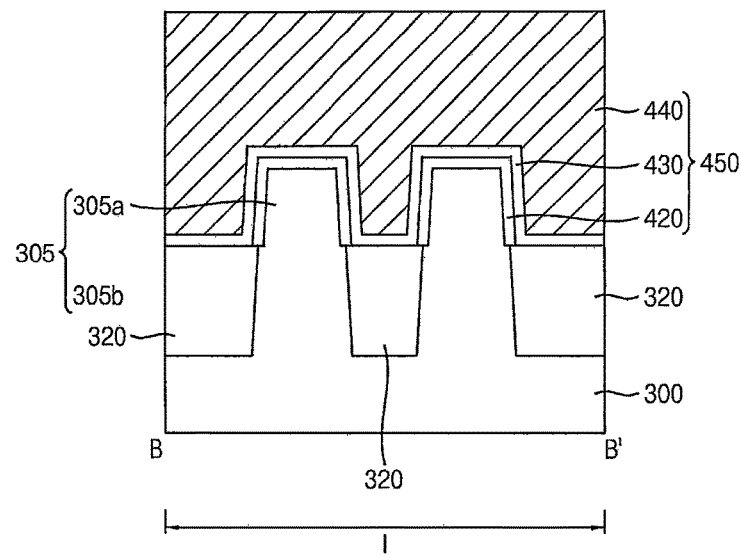

FIGS. 21, 26, 29, 32, 35 and 41 are cross-sectional views taken along lines A-A' of corresponding plan views, FIGS. 23 and 38 are cross-sectional views taken along lines B-B' of corresponding plan views, and FIGS. 24, 27, 30, 33, 36, 39, 42 and 44-46 are cross-sectional views taken along lines C-C' of corresponding plan views.

Figure 20:
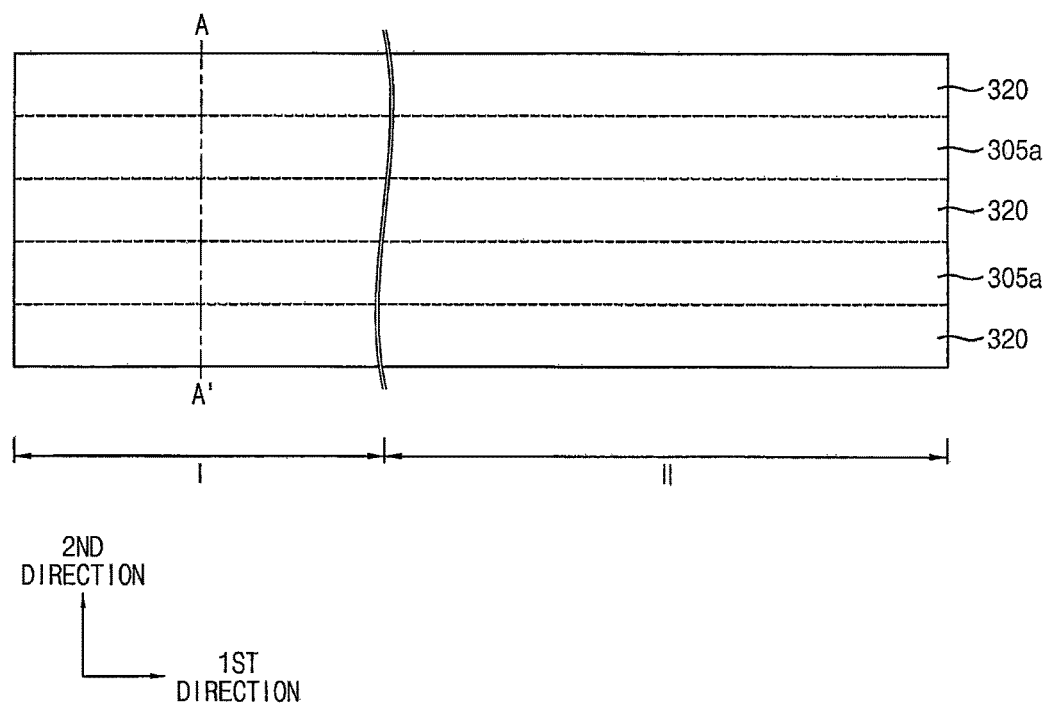
Figure 21:
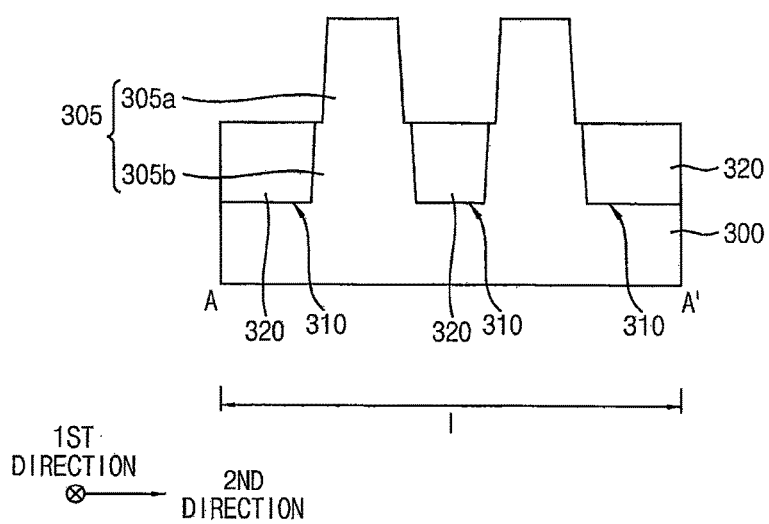

Referring to FIGS. 20 and 21, an upper portion of a substrate 300 may be partially removed to form first recesses 310, and an isolation pattern 320 may be formed to fill a lower portion of each of the first recesses 310.

The substrate 300 may include a semiconductor material, e.g., silicon, germanium, silicon-germanium, etc., and/or III-V semiconductor compounds, e.g., GaP, GaAs, GaSb, etc. In some example embodiments, the substrate 300 may be an SOI substrate or a GOI substrate.

In some example embodiments, the isolation pattern 320 may be formed by forming an isolation layer on the substrate 300 to sufficiently fill the first recesses 310, planarizing the isolation layer until a top surface of the substrate 300 may be exposed, and removing an upper portion of the isolation layer. When the isolation layer is removed, an upper portion of the substrate 300 adjacent thereto may be also removed, and thus a portion of the substrate 300 of which a sidewall may not be covered by the isolation pattern 320 may have a width smaller than a width of a portion of the substrate 300 of which a sidewall may be covered by the isolation pattern 320. The isolation layer may be formed of an oxide, e.g., silicon oxide.

As the isolation pattern 320 may be formed on the substrate 300, a field region having a top surface covered by the isolation pattern 320 and an active region having a top surface not covered by the isolation pattern 320 may be defined in the substrate 300. The active region may have a fin-like shape protruding from the substrate 300, and thus may be referred to as an active fin 305.

In some example embodiments, the active fin 305 may be formed to extend in a first direction substantially parallel to the top surface of the substrate 300, and a plurality of active fins 305 may be formed in a second direction substantially parallel to the top surface of the substrate 300 and substantially perpendicular to the first direction.

In some example embodiments, the active fin 305 may include a lower active pattern 305b of which a sidewall may be covered by the isolation pattern 320, and an upper active pattern 305a protruding above a top surface of the isolation pattern 320. In some example embodiments, the upper active pattern 305a may have a width in the second direction slightly smaller than a width of the lower active pattern 305b in the second direction.

Figure 22:
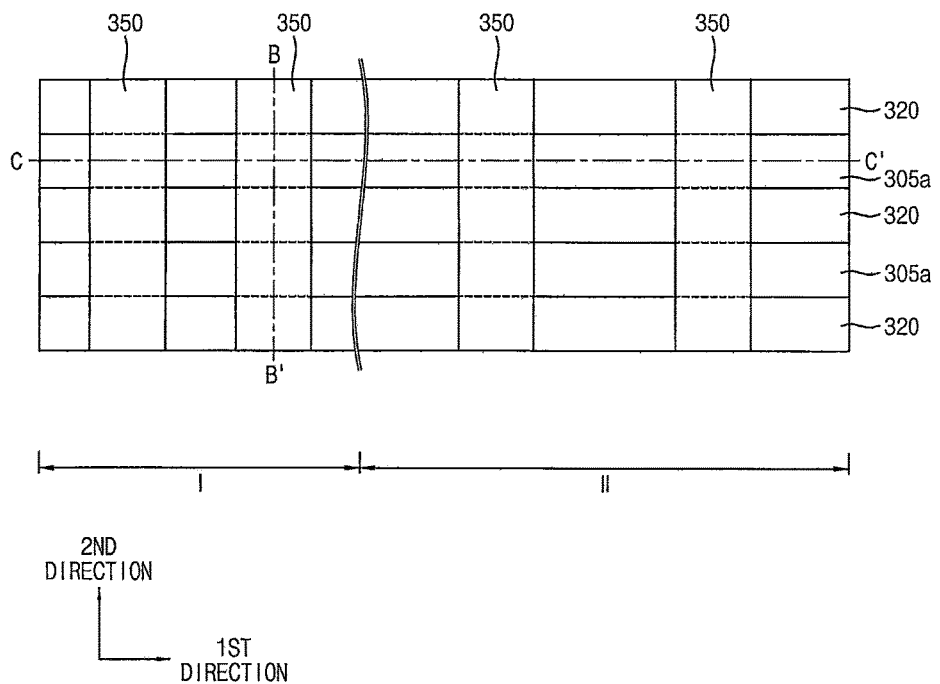
Figure 24:
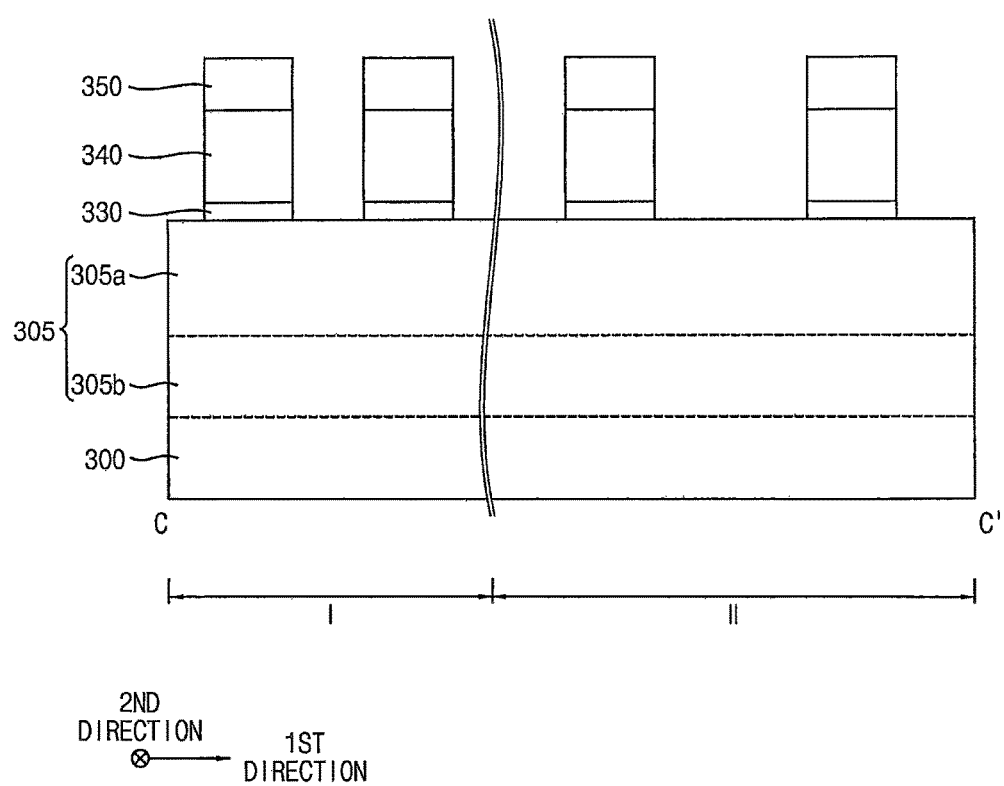

Referring to FIGS. 22 to 24, a dummy gate layer structure may be formed on the substrate 300.

The dummy gate structure may be formed by sequentially forming a dummy gate insulation layer, a dummy gate electrode layer, and a gate mask layer on the active fin 305 of the substrate 300 and the isolation pattern 320, patterning the gate mask layer by a photolithography process using a photoresist pattern (not shown) to form a gate mask 350, and sequentially etching the dummy gate electrode layer and the dummy gate insulation layer. Thus, the dummy gate structure may be formed to include a dummy gate insulation pattern 330, a dummy gate electrode 340 and the gate mask 350 sequentially stacked on the active fin 305 of the substrate 300 and a portion of the isolation pattern 320 adjacent to the active fin 305 in the second direction.

The dummy gate insulation layer may be formed of an oxide, e.g., silicon oxide, the dummy gate electrode layer may be formed of, e.g., polysilicon, and the gate mask layer may be formed of a nitride, e.g., silicon nitride. The dummy gate insulation layer may be formed by a CVD process, an ALD process, or the like. Some embodiments provide that the dummy gate insulation layer may be formed by a thermal oxidation process on an upper portion of the substrate 300, and in this case, the dummy gate insulation layer may not be formed on the isolation pattern 320 but formed only on the active fin 305. The dummy gate electrode layer, and the gate mask layer may be also formed by a CVD process, an ALD process, etc.

In some example embodiments, the dummy gate structure may be formed to extend in the second direction on the active fins 305 of the substrate 300 and the isolation pattern 320, and a plurality of dummy gate structures may be formed in the first direction. In some example embodiments, the dummy gate structures in the first region I may be spaced apart from each other at a distance smaller than a distance between the dummy gate structures spaced apart from each other in the second direction II.

An ion implantation process may be further performed to form an impurity region (not shown) at an upper portion of the active fin 305 adjacent the dummy gate structure.

Figure 25:
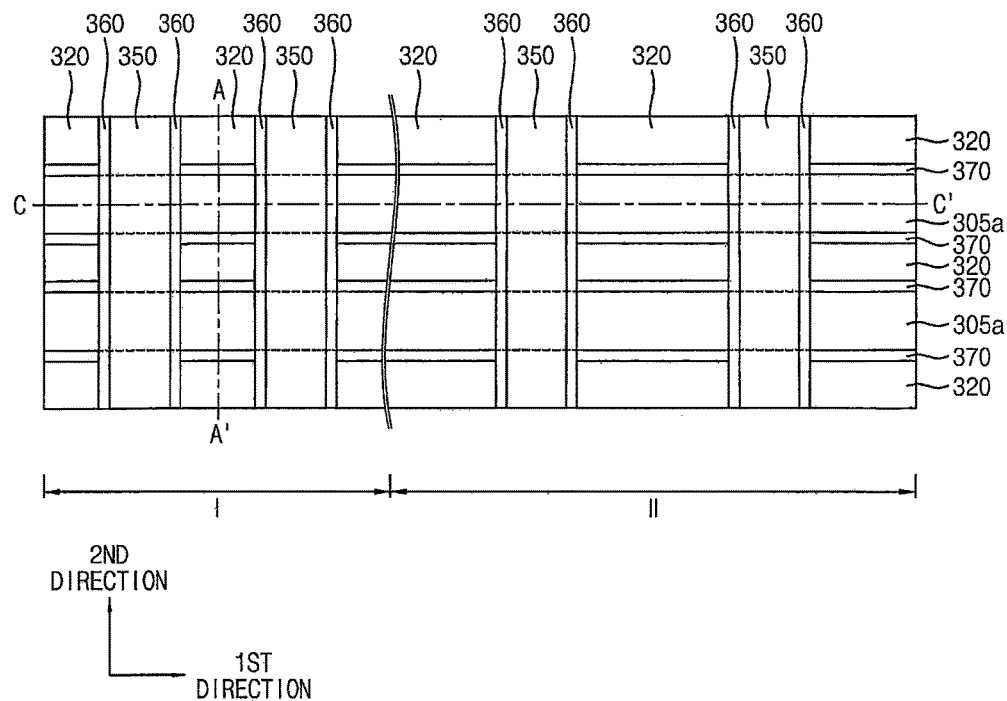
Figure 26:
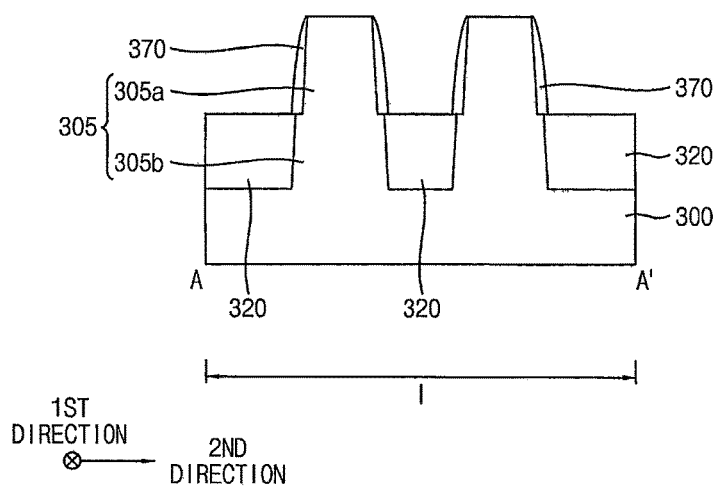
Figure 27:
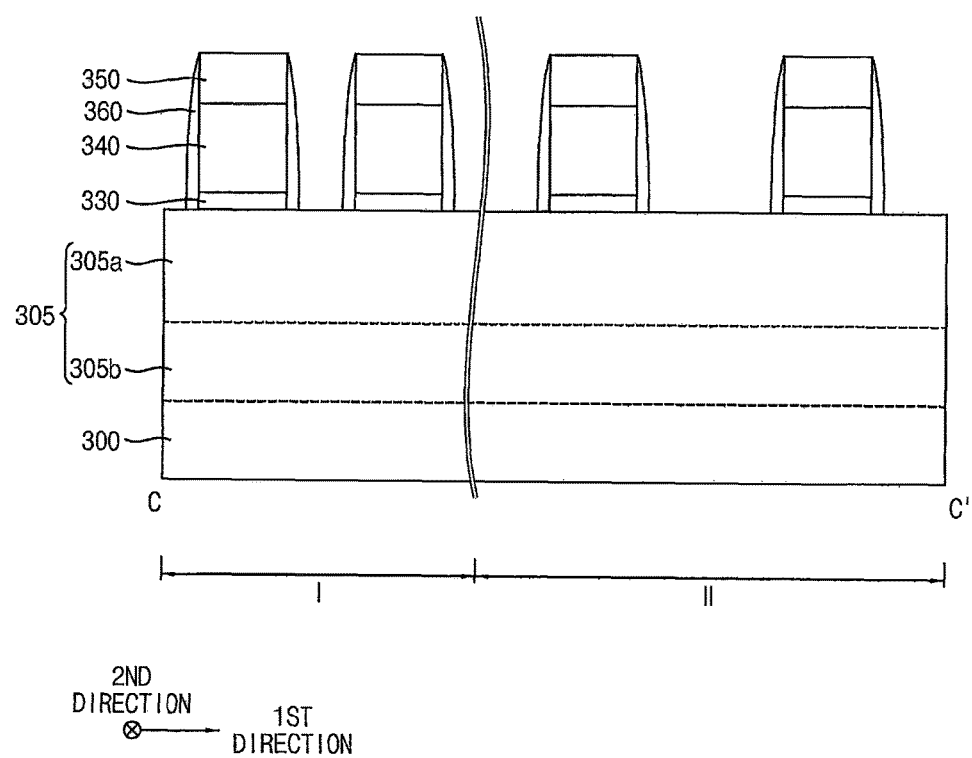

Referring to FIGS. 25 to 27, a gate spacer 360 and a fin spacer 370 may be formed on sidewalls of the dummy gate structure and sidewalls of the active fin 305, respectively.

In some example embodiments, the gate spacer 360 and the fin spacer 370 may be formed by forming a spacer layer on the dummy gate structure, the active fin 305 and the isolation pattern 320, and anisotropically etching the spacer layer. The spacer layer may be formed of a nitride, e.g., silicon nitride, silicon carbonitride, etc.

The gate spacer 360 may be formed on the sidewalls of the dummy gate structure opposed to each other in the first direction, and the fin spacer 370 may be formed on the sidewalls of the active fin 305 opposed to each other in the second direction.

Figure 28:
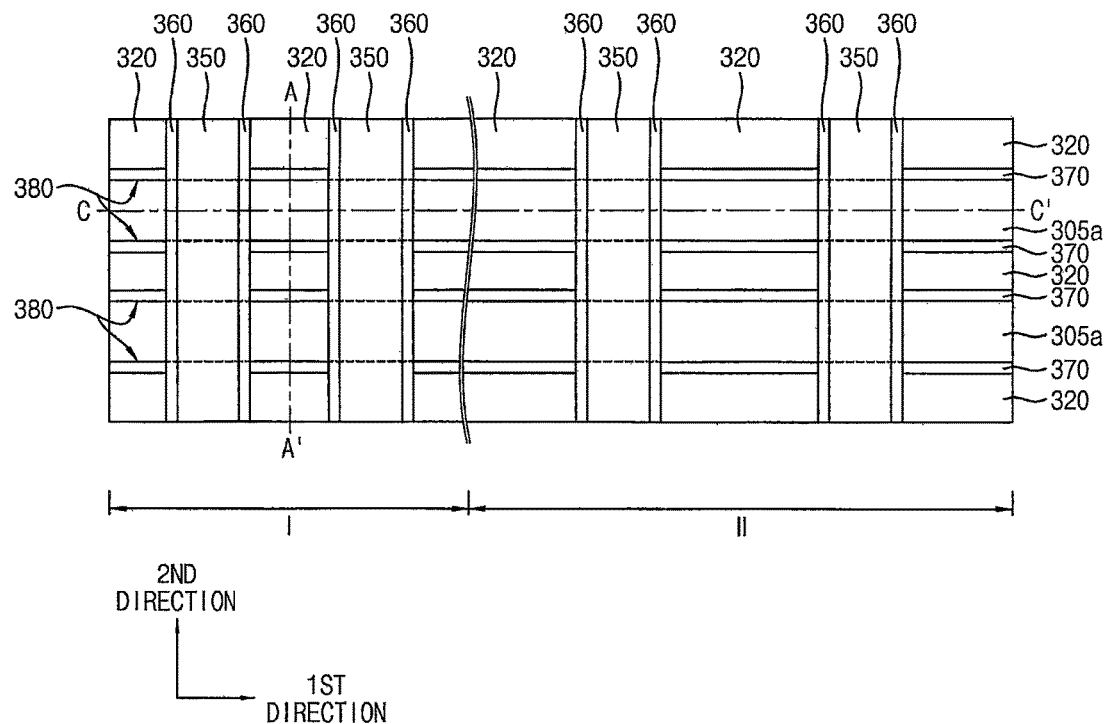
Figure 29:
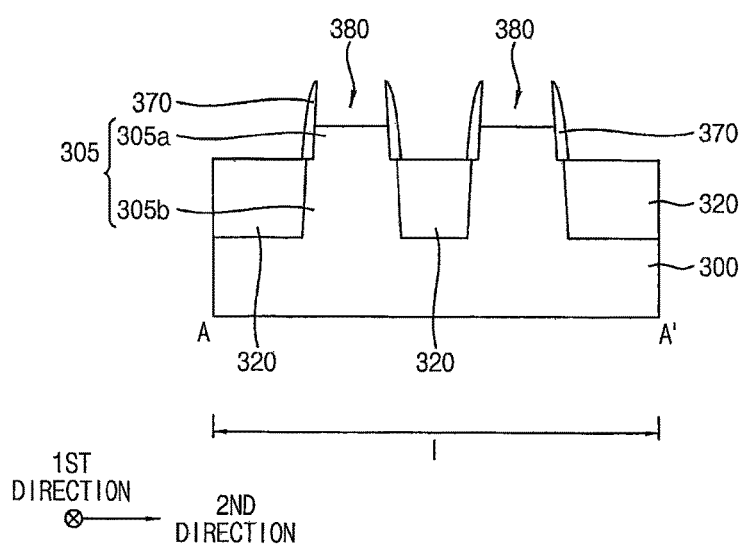
Figure 30:
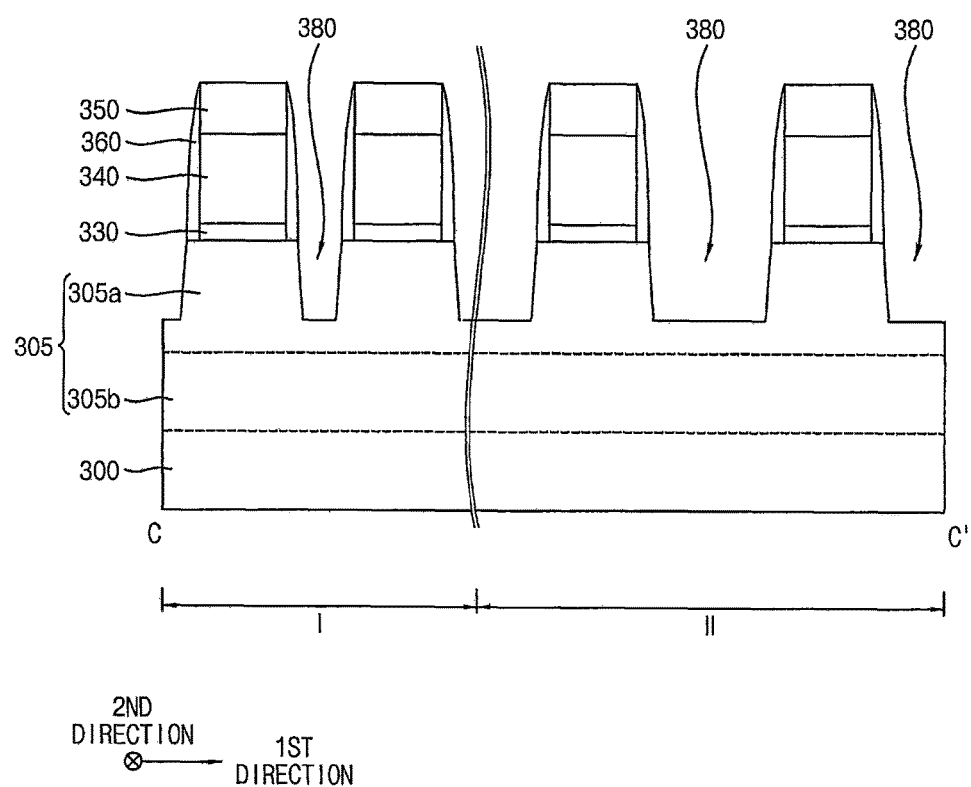

Referring to FIGS. 28 to 30, an upper portion of the active fin 305 adjacent the dummy gate structure may be etched to form a second recess 380.

Particularly, the upper portion of the active fin 305 may be etched using the dummy gate structure and the gate spacer 360 as an etching mask. FIGS. 28 to 30 show that the upper active pattern 305a in the active fin 305 is etched to form the second recess 380, however, the inventive concepts may not be limited thereto. For example, the second recess 380 may be formed by removing the upper active pattern 305a to expose the lower active pattern 305b, and further, a portion of the lower active pattern 305b may be removed when the second recess 380 is formed.

As the dummy gate structures may be formed to be spaced apart from each other in the first region I at a distance smaller than a distance between the dummy gate structures spaced apart from each other in the second region II, the second recess 380 in the first region I may be formed to have a width in the first direction smaller than a width in the first direction of the second recess 380 in the second region II.

Figure 31:
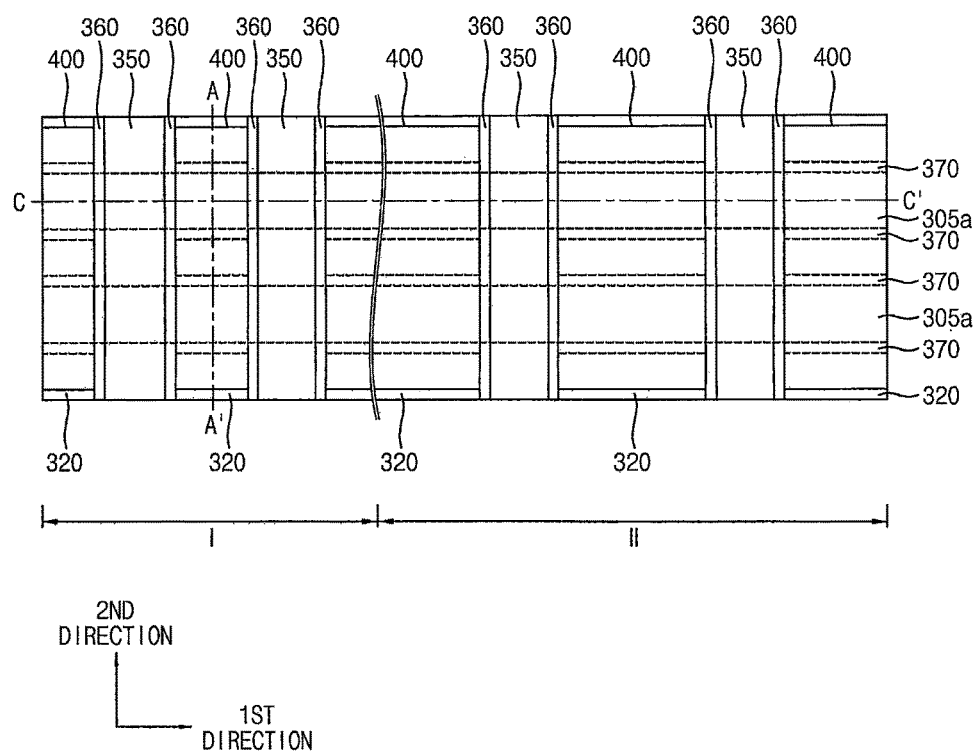
Figure 32:
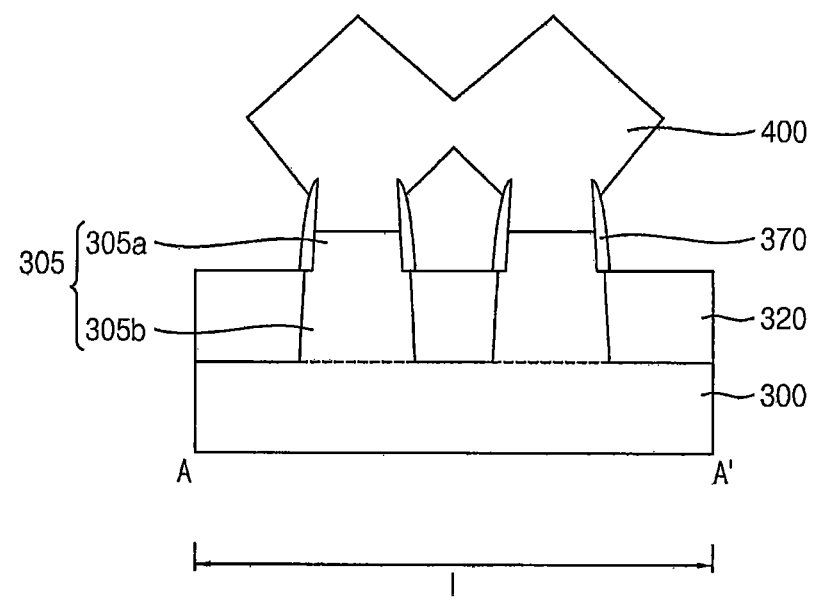
Figure 33:
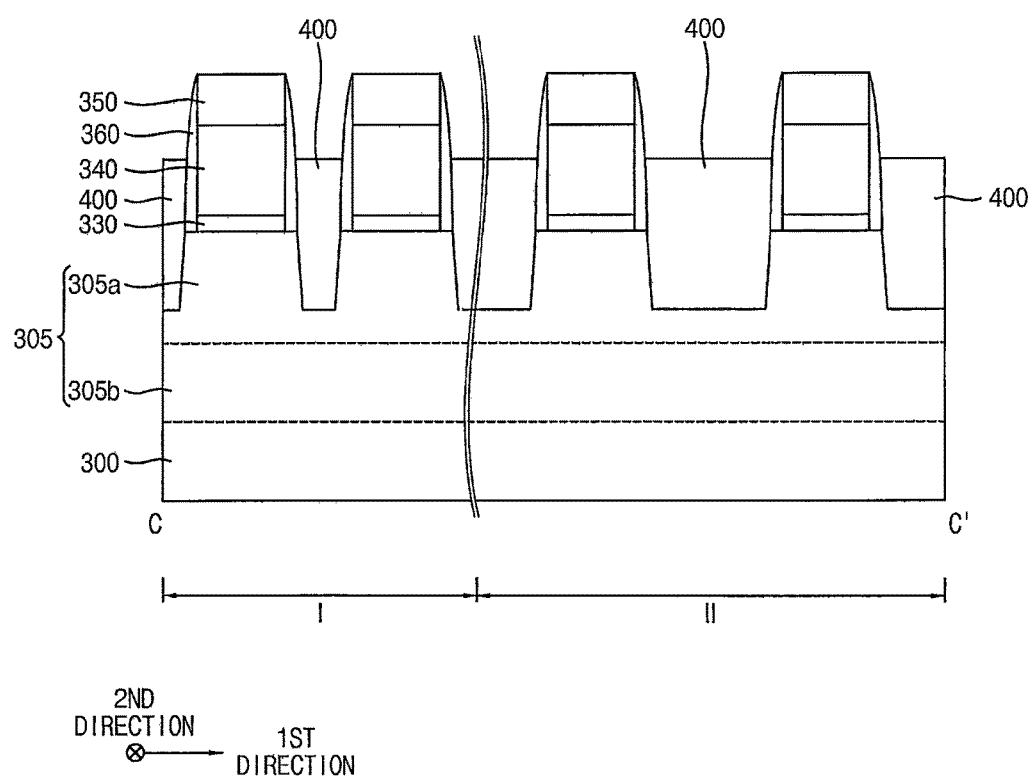

Referring to FIGS. 31 to 33, a source/drain layer 400 may be formed on the active fin 305 to fill the second recess 380.

In some example embodiments, the source/drain layer 400 may be formed by a selective epitaxial growth (SEG) process using a top surface of the active fin 305 exposed by the second recess 380 as a seed.

In some example embodiments, the SEG process may be performed using a silicon source gas, e.g., disilane ($Si_2H_6$) gas and a carbon source gas, e.g., monomethylsilane ($SiH_3CH_3$) gas to form a single crystalline silicon carbide layer. Some embodiments provide that the SEG process may be performed using only a silicon source gas, e.g., disilane ($Si_2H_6$) gas to form a single crystalline silicon layer. An n-type impurity source gas, e.g., phosphine ($PH_3$) gas may be also used to form a single crystalline silicon carbide layer doped with n-type impurities or a single crystalline silicon layer doped with n-type impurities. Accordingly, the source/drain layer 400 may serve as a source/drain region of an NMOS transistor.

Some embodiments provide that the SEG process may be performed using a silicon source gas, e.g., dichlorosilane ($SiH_2Cl_2$) gas, and a germanium source gas, e.g., germane ($GeH_4$) gas to form a single crystalline silicon-germanium layer. A p-type impurity source gas, e.g., diborane ($B_2H_6$) gas may be also used to form a single crystalline silicon-germanium layer doped with p-type impurities. Accordingly, the source/drain layer 400 may serve as a source/drain region of a PMOS transistor.

The source/drain layer 400 may grow both in vertical and horizontal directions, and thus may not only fill the second recess 380 but also contact a portion of the gate spacer 360 An upper portion of the source/drain layer 400 may have a cross-section taken along the second direction of which a shape may be pentagon or hexagon. When the active fins 305 are spaced apart from each other in the second direction at a short distance, neighboring ones of the source/drain layers 400 in the second direction may be merged with each other to form a single layer.

Figure 34:
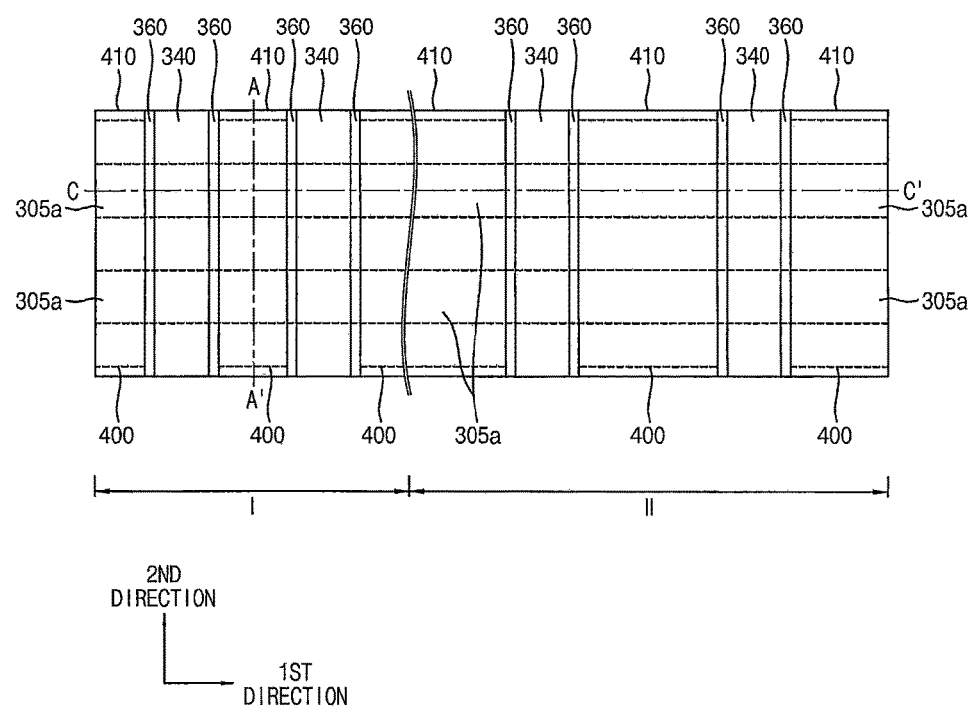
Figure 35:
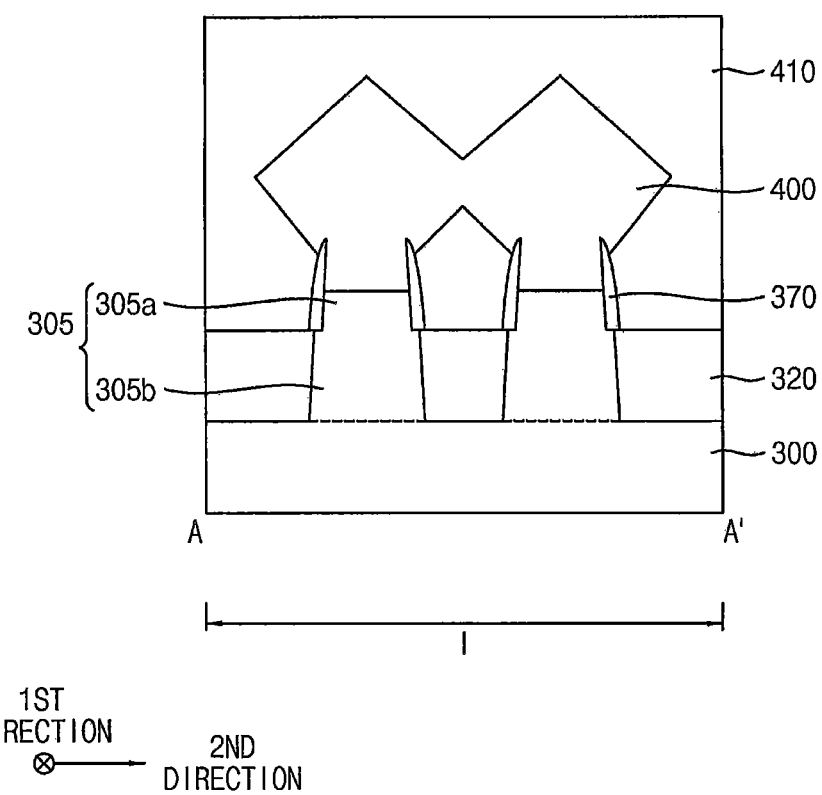
Figure 36:
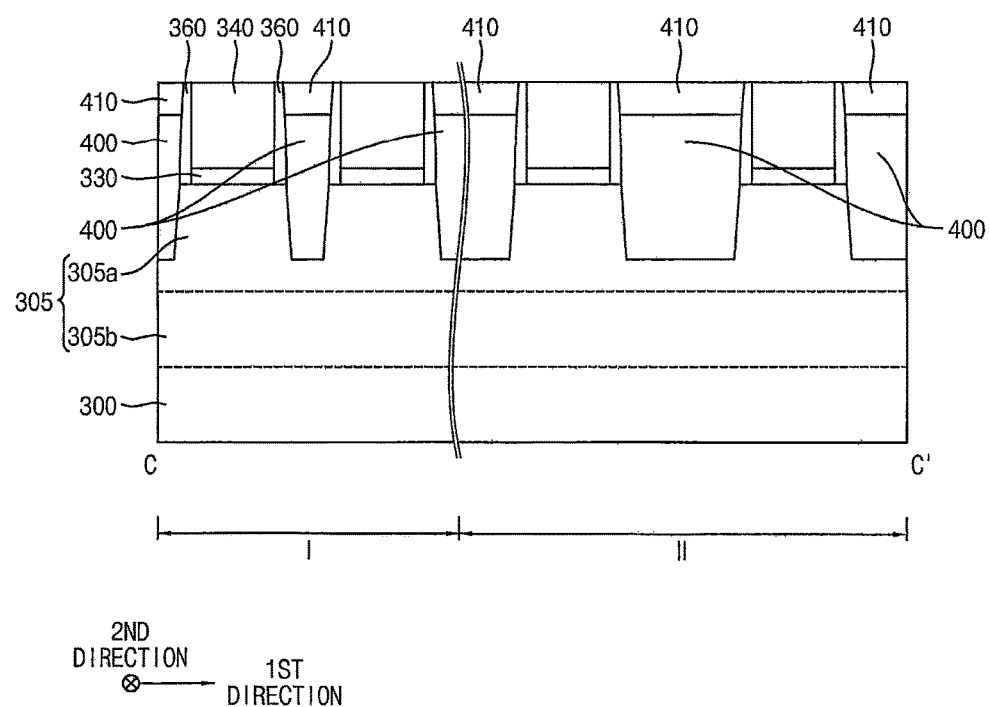

Referring to FIGS. 34 to 36, a first insulating interlayer 410 may be formed on the active fin 305 and the isolation pattern 320 to cover the dummy gate structure, the gate spacer 360, the fin spacer 370 and the source/drain layer 400, and the first insulating interlayer 410 may be planarized until a top surface of the dummy gate electrode 340 of the dummy gate structure may be exposed. The gate mask 350 may be also removed, and an upper portion of the gate spacer 360 may be also removed.

The first insulating interlayer 410 may be formed of an oxide, e.g., silicon oxide. The planarization process may be performed by a CMP process and/or an etch back process.

Figure 37:
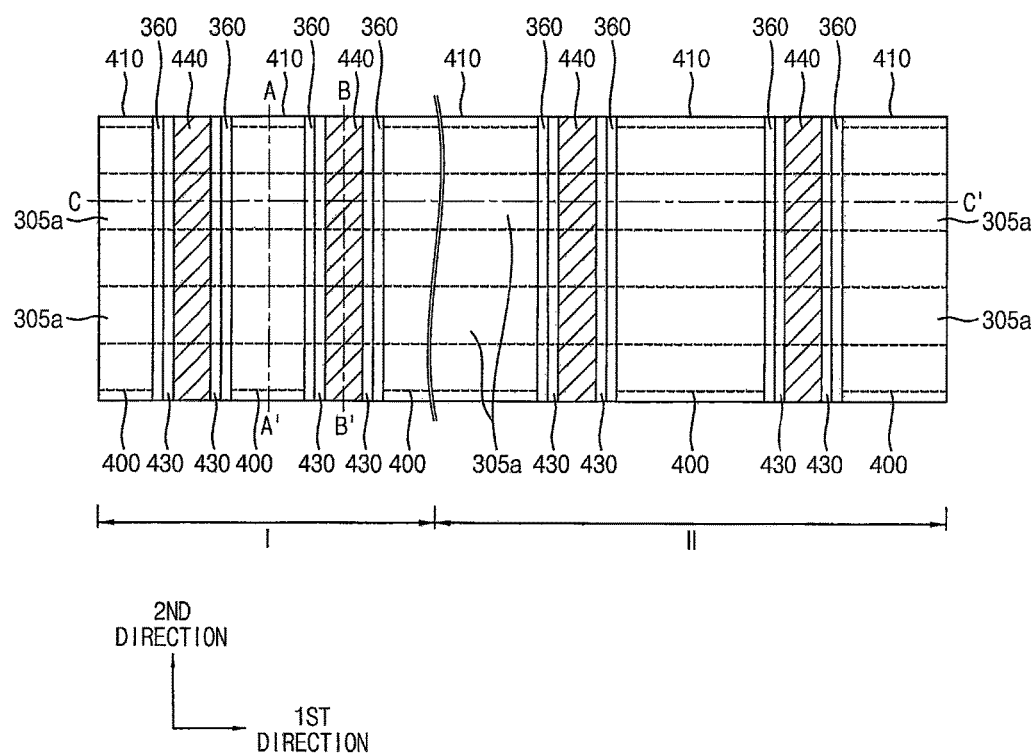
Figure 39:
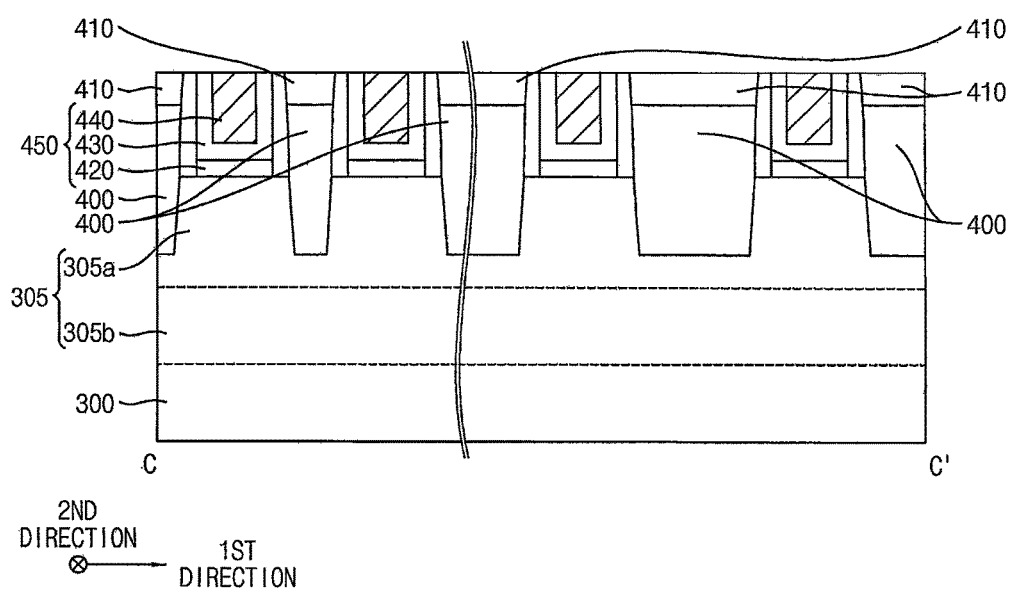

Referring to FIGS. 37 to 39, the exposed dummy gate electrode 340, and the dummy gate insulation pattern 330 thereunder may be removed to form an opening (not shown) exposing a top surface of the active fin 305 and an inner sidewall of the gate spacer 360. A gate structure 450 may be formed to fill the opening.

Particularly, after a thermal oxidation process may be performed on the exposed top surface of the active fin 305 to form an interface pattern 420, a gate insulation layer may be formed on the interface pattern 420, the isolation pattern 320, the gate spacer 360 and the first insulating interlayer 410, and a gate electrode layer may be formed on the gate insulation layer to sufficiently fill a remaining portion of the opening.

The gate insulation layer may be formed of a metal oxide having a high dielectric constant, e.g., hafnium oxide, tantalum oxide, zirconium oxide, or the like, by a CVD process, a PVD process, an ALD process, or the like. The gate electrode layer may be formed of a material having a low resistance, e.g., a metal such as aluminum, copper, tantalum, etc., or a metal nitride thereof, by a CVD process, a PVD process, an ALD process, or the like. In some example embodiments, a heat treatment process, e.g., a rapid thermal annealing (RTA) process, a spike rapid thermal annealing (spike RTA) process, a flash rapid thermal annealing (flash RTA) process and/or a laser annealing process may be further performed on the gate electrode layer. Some embodiments provide that the gate electrode layer may be formed of doped polysilicon The interface pattern 420 may be formed by a CVD process, a PVD process, an ALD process instead of the thermal oxidation process, and in this case, the interface pattern 420 may be formed not only on the top surface of the active fin 305 but also on the top surface of the isolation layer pattern 320 and the inner sidewall of the gate spacer 360.

The gate electrode layer and the gate insulation layer may be planarized until the top surface of the first insulating interlayer 410 may be exposed to form a gate insulation pattern 430 on the top surface of the interface pattern 430 and the inner sidewall of the gate spacer 360, and a gate electrode 440 filling a remaining portion of the opening on the gate insulation pattern 430. Thus, a bottom and a sidewall of the gate electrode 440 may be covered by the gate insulation pattern 430. In some example embodiments, the planarization process may be performed by a CMP process and/or an etch back process.

The interface pattern 420, the gate insulation pattern 430 and the gate electrode 440 sequentially stacked may form the gate structure 450, and the gate structure 450 and the source/drain layer 400 may form an NMOS transistor or a PMOS transistor.

Figure 40:
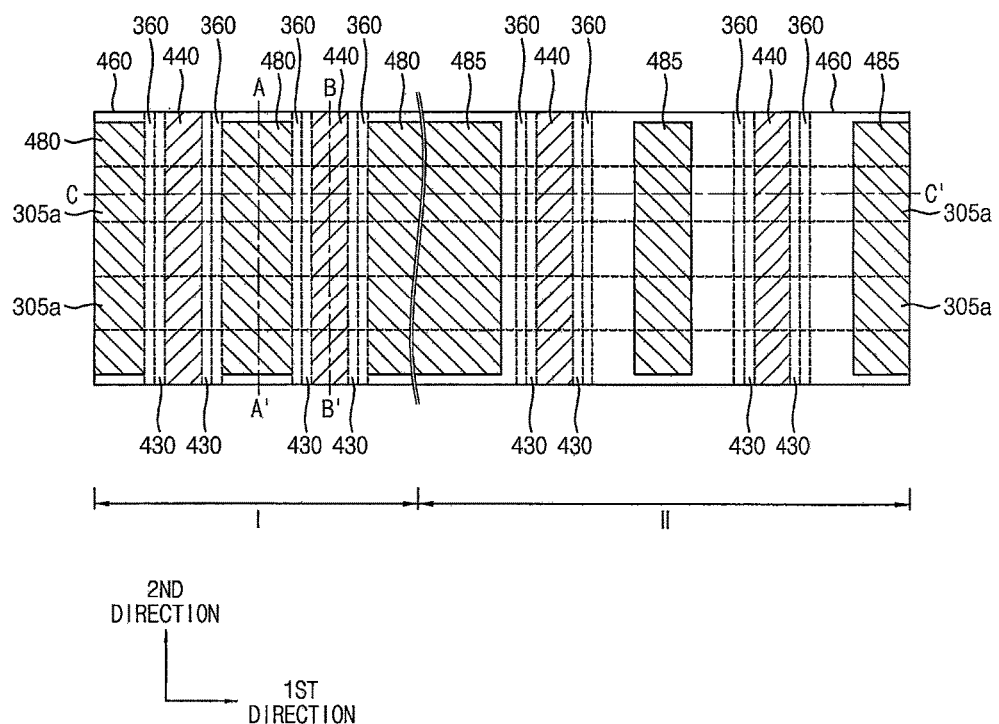
Figure 41:
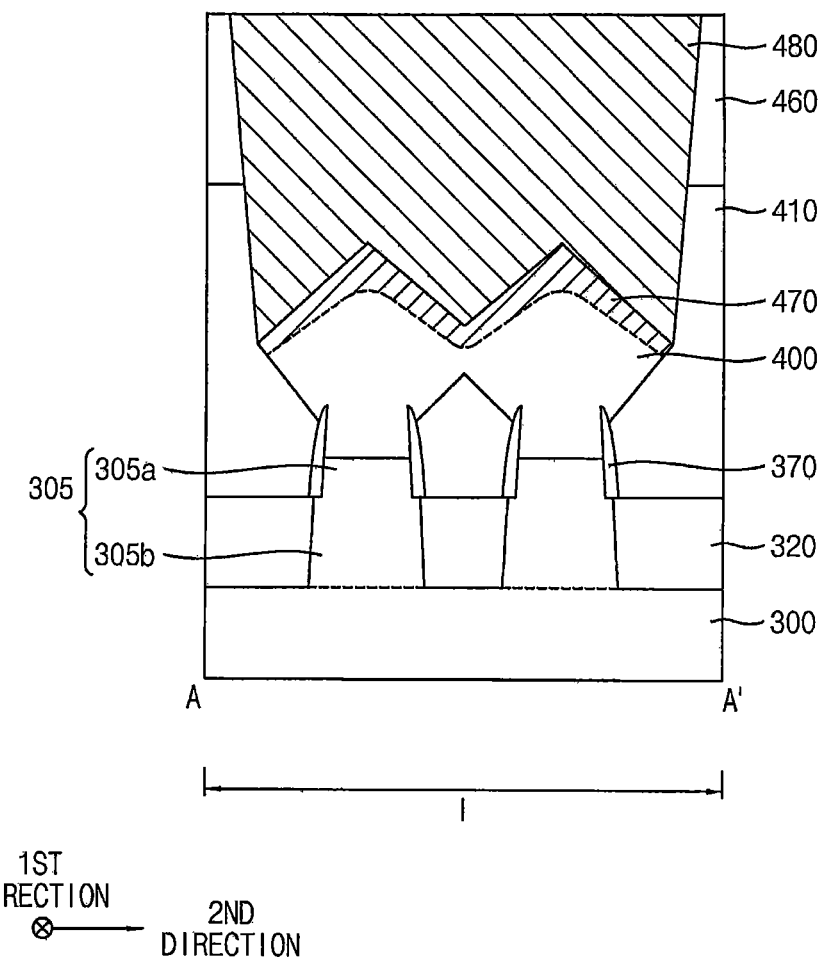
Figure 42:
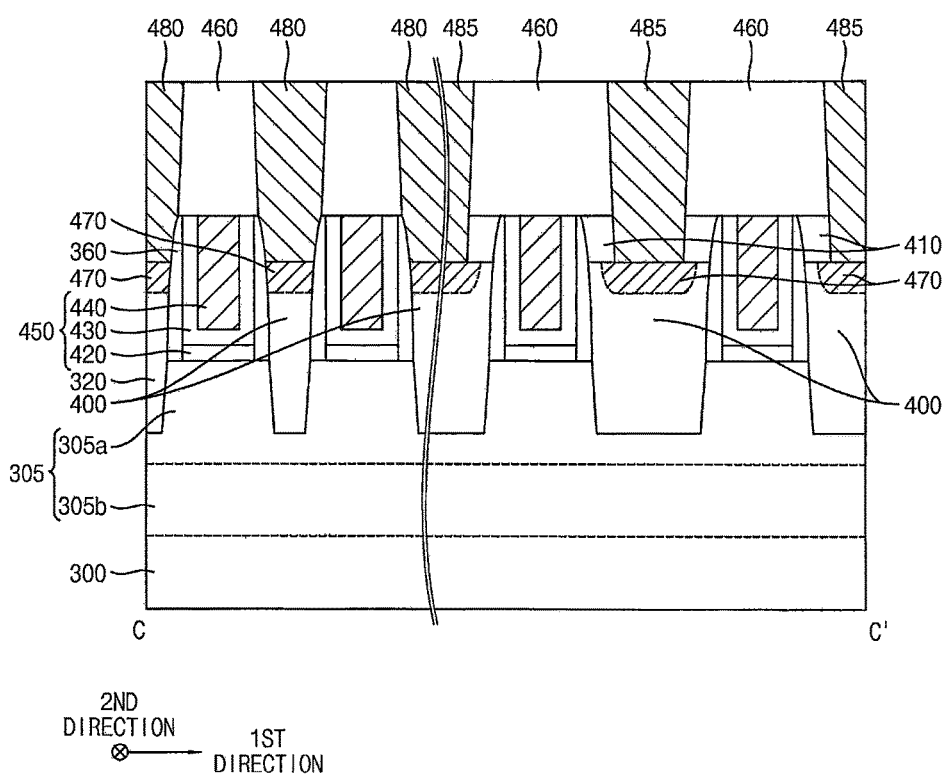

Referring to FIGS. 40 to 42, a second insulating interlayer 460 may be formed on the first insulating interlayer 410, the gate structure 450, and the gate spacer 360, and first and second contact plugs 480 and 485 may be formed through the first and second insulating interlayers 410 and 460 to contact top surfaces of the source/drain layers 400.

The second insulating interlayer 460 may be formed of a material substantially the same as or different from that of the first insulating interlayer 410. For example, the second insulating interlayer 460 may be formed of an oxide, e.g., silicon oxide.

The first and second contact plugs 480 and 485 may be formed by forming first and second contact holes (not shown) through the first and second insulating interlayers 410 and 460 to expose the top surfaces of the source/drain layers 400, and forming a conductive layer to fill the first and second contact holes. The conductive layer may be formed of, e.g., a metal, a metal nitride, and/or doped polysilicon.

The first and second contact holes may be formed in the first and second regions I and II, respectively, and the first and second contact plugs 480 and 485 filling the first and second contact holes, respectively, may be also formed in the first and second regions I and II, respectively.

In some example embodiments, each of the first contact plugs 480 may be self-aligned with the gate spacer 360 on the sidewall of the gate structure 450, and each of the second contact plugs 485 may not be self-aligned with the gate spacer 360. However, the inventive concepts may not be limited thereto. The first contact plugs 480 may be disposed in the first region I at a distance from each other smaller than a distance between the second contact plugs 485 disposed in the second region II.

Metal silicide patterns 470 may be formed on the source/drain layers 400 by forming a metal layer on the top surfaces of the source/drain layers 400 exposed by the first and second contact holes, performing a heat treatment on the metal layer, and removing an unreacted portion thereof. The metal layer may be formed of, e.g., cobalt, nickel, etc.

Figure 43:
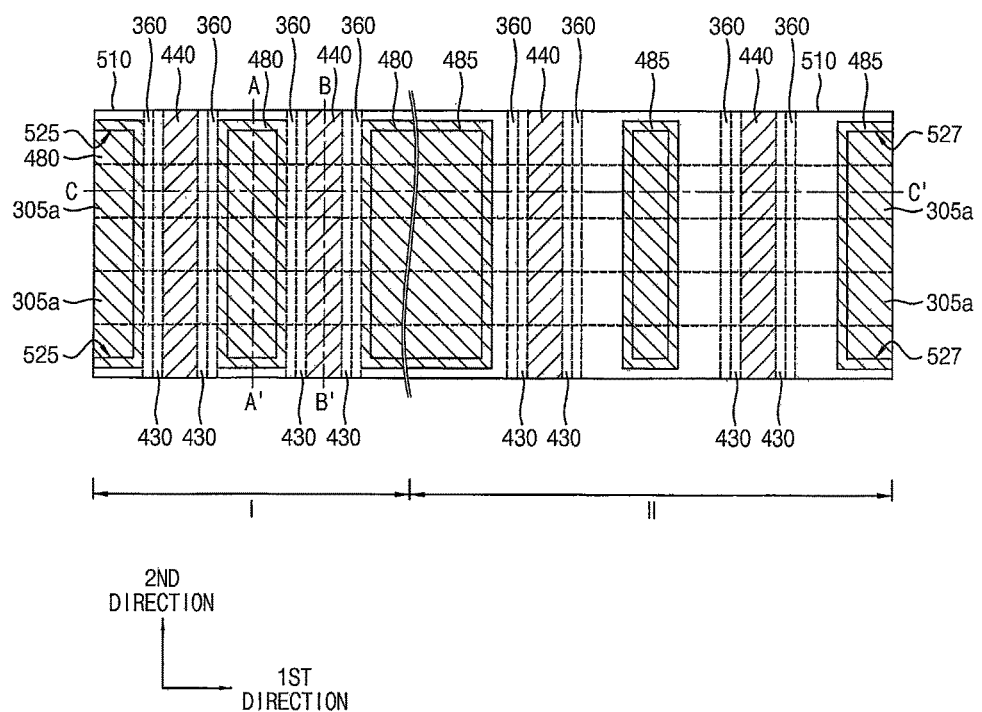
Figure 44:
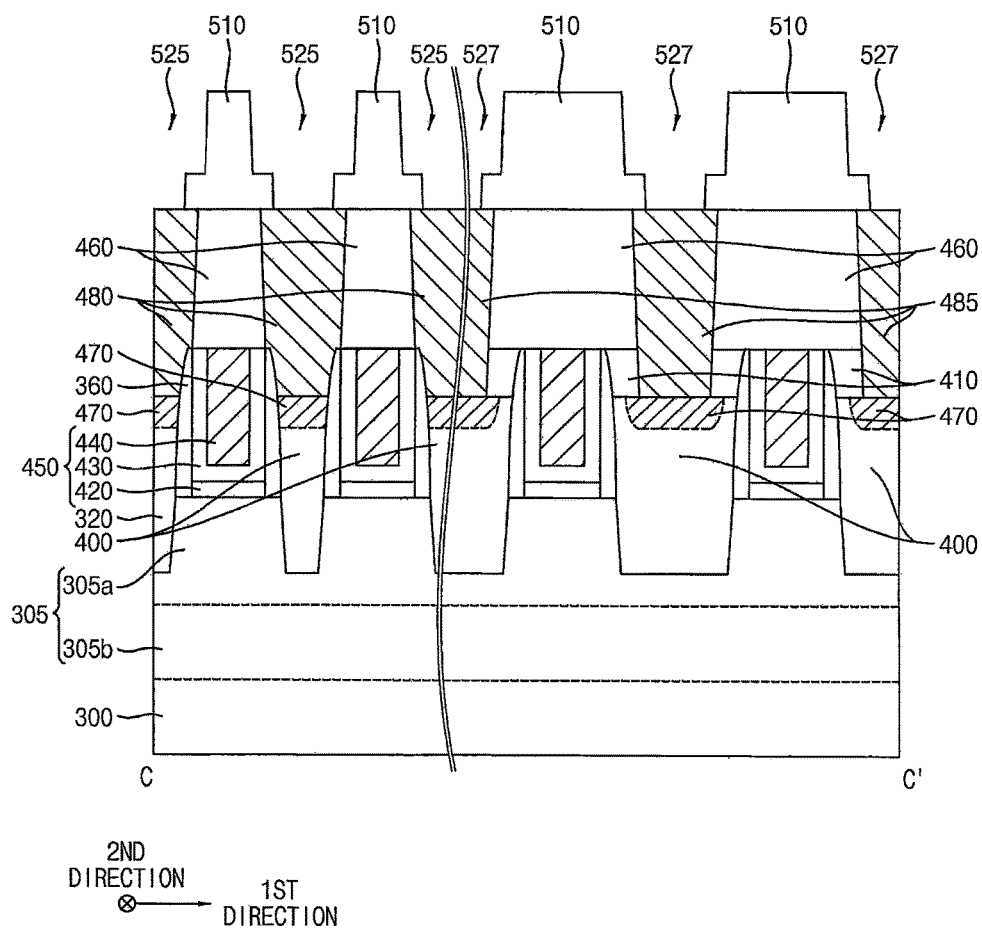

Referring to FIGS. 43 to 44, a process substantially the same as or similar to that of FIG. 12 may be performed.

Particularly, after forming a third insulating interlayer 510 on the second insulating interlayer 460, and the first and second contact plugs 480 and 485, third and fourth openings 525 and 527 may be formed to expose top surfaces of the first and second contact plugs 480 and 485, respectively. The third insulation interlayer 510 may be formed of a low-k dielectric material, e.g., silicon oxide doped with carbon (SiCOH) and/or silicon oxide doped with fluorine ($F—SiO_2$), a porous silicon oxide, spin on organic polymer, and/or an inorganic polymer, e.g., hydrogen silsesquioxane (HSSQ), methyl silsesquioxane (MSSQ), etc.

The third and fourth openings 525 and 527 may be formed by removing an upper portion of the third insulating interlayer 510 to form a trench, and removing a lower portion of the third insulating interlayer 510 to form a via hole in communication with the trench. The via hole may have a width smaller than that of the trench, and may expose top surfaces of the first and second contact plugs 480 and 485. The third openings 525 may be spaced apart from each other in the first direction at a distance smaller than a distance of the fourth openings 527 spaced apart from each other in the first direction.

Figure 45:
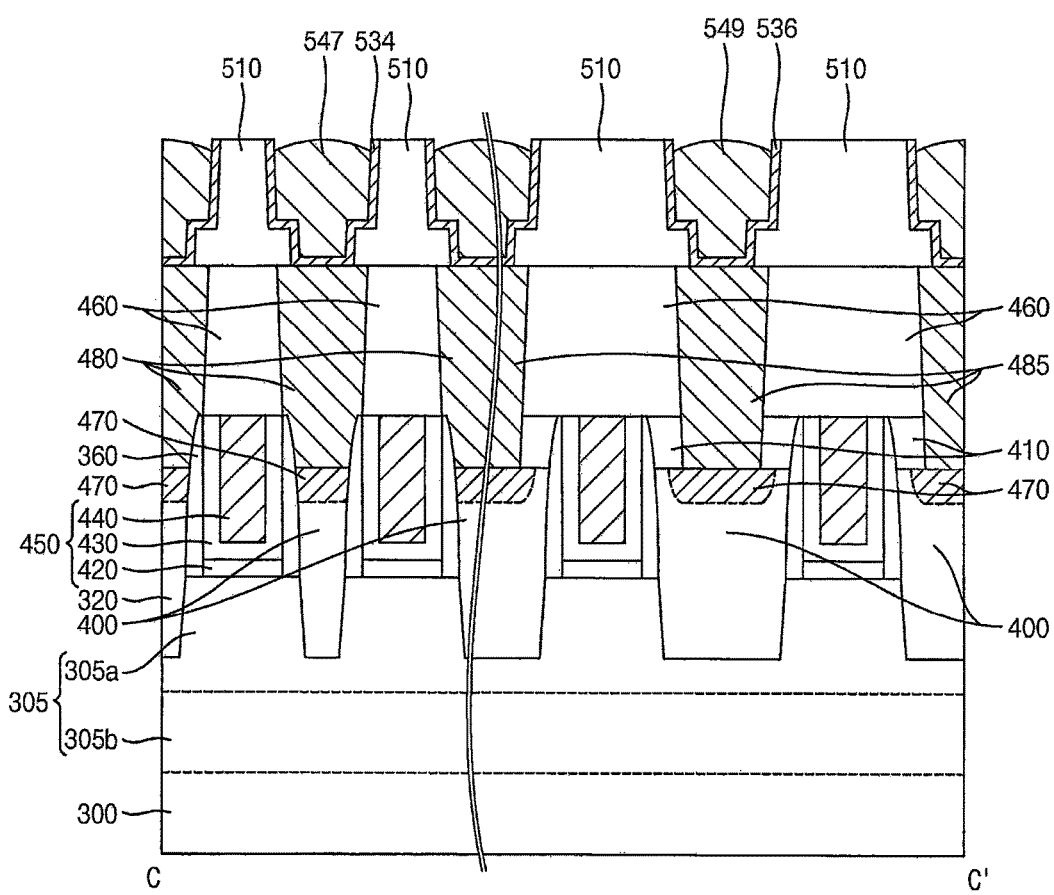
Figure 45:
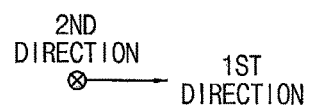

Referring to FIG. 45, a process substantially the same as or similar to that of FIG. 13 may be performed.

Thus, a first preliminary barrier pattern 534 and a first metal pattern 547 may be formed in each of the third openings 525, and a second preliminary barrier pattern 536 and a second metal pattern 549 may be formed in each of the fourth openings 527. Each of the first and second metal patterns 547 and 549 may have an upper portion having a relatively wide width, and a lower portion having a relatively narrow width, which may correspond to the shape of each of the third and fourth openings 525 and 527.

Figure 46:
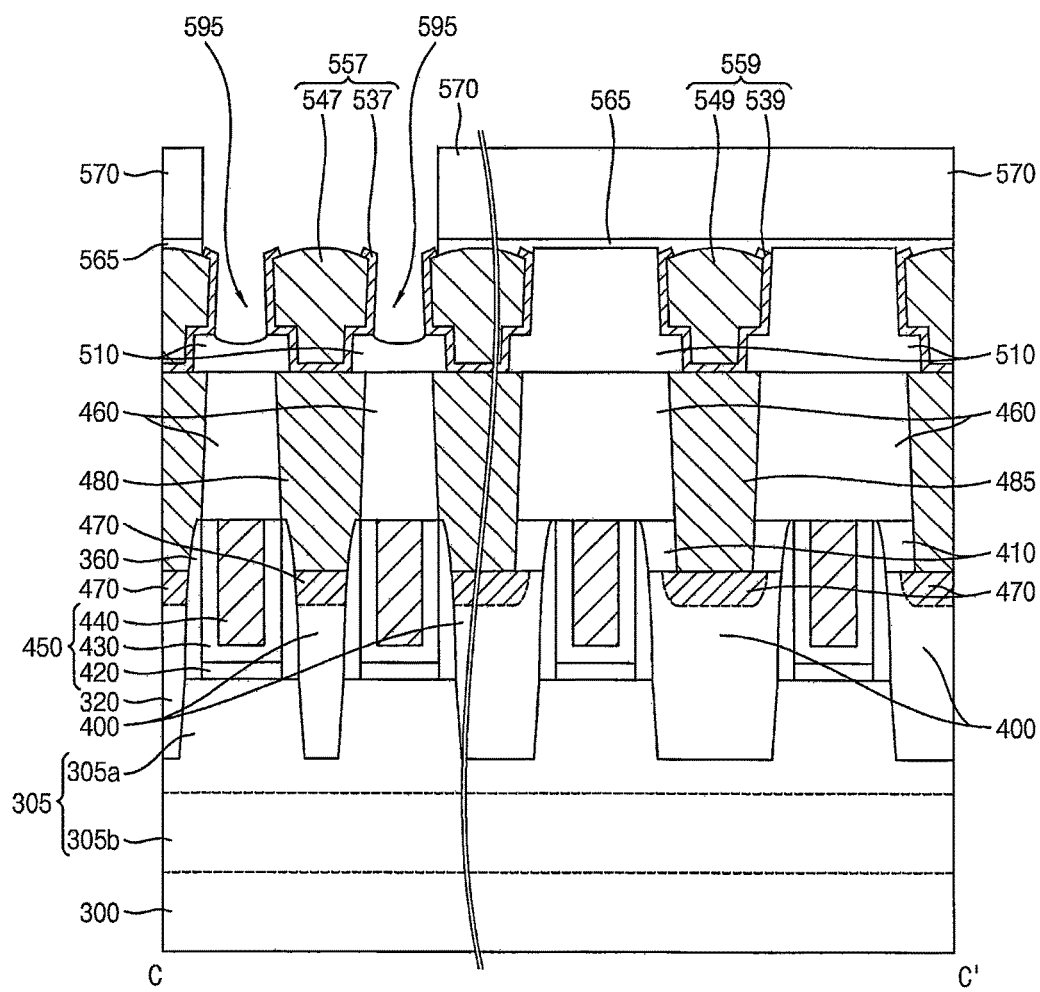

Referring to FIG. 46, a process substantially the same as or similar to that of FIG. 14 may be performed.

Thus, first wiring structures 557 each including a first barrier pattern 537 and the first metal pattern 547 may be formed on the first contact plugs 480 in the first region I, and second wiring structures 559 each including a second barrier pattern 539 and the second metal pattern 549 may be formed on the second contact plugs 485 in the second region II.

Additionally, a first diffusion barrier pattern 565 may be formed on a top surface of the third insulating interlayer 510, and a portion of top surfaces of outermost ones of the first wiring structures 557 in the first direction in the first region I. A third recess 595 may be formed on a portion of the third insulating interlayer 510 between the first wiring structures 557 in the first region I by a remote plasma etching process. The first diffusion barrier pattern 565 may be formed on the top surface of the third insulating interlayer 510 and top surfaces of the second wiring structures 559 in the second region II. That is, in the first region I in which the first wiring structures 557 may be formed to be spaced apart from each other at a relatively short distance, the third recess 595 for forming an air gap 630 may be formed between the first wiring structures 557, while in the second region II in which the second wiring structures 559 may be formed to be spaced apart from each other at a relatively long distance, the third recess 595 for forming the air gap 630 may not be formed.

Referring to FIGS. 16 to 19 again, a process substantially the same as or similar to that FIG. 11 may be performed to complete the semiconductor device.

That is, after forming a second diffusion barrier layer 600 on a top surface of the first diffusion barrier pattern 565, top surfaces of the first wirings 557 and the top surface of the third insulating interlayer 510, a fourth insulating interlayer 620 may be formed on the second diffusion barrier layer 600 so that the air gap 630 may be formed between the first wiring structures 557. The fourth insulating interlayer 620 may be formed of a low-k dielectric material, e.g., silicon oxide doped with carbon (SiCOH) or silicon oxide doped with fluorine (F—SiO$_2$), a porous silicon oxide, spin on organic polymer, or an inorganic polymer, e.g., hydrogen silsesquioxane (HSSQ), methyl silsesquioxane (MSSQ), etc.

By the above processes, the semiconductor devices may be manufactured.

The above semiconductor devices and the methods of manufacturing the same may be applied to various types of memory devices including wiring structures and methods of manufacturing the same. For example, the semiconductor device may be applied to wiring structures of logic devices such as central processing units (CPUs), main processing units (MPUs), or application processors (APs), or the like. Additionally, the semiconductor device may be applied to wiring structures of volatile memory devices such as DRAM devices or SRAM devices, or wiring structures of non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a plurality of wiring structures that are spaced apart from each other, each of the wiring structures including:
   a metal pattern; and
   a barrier pattern on a sidewall of the metal pattern, a bottom surface of the metal pattern, and an edge portion of a top surface of the metal pattern and not on a central portion of the top surface of the metal pattern; and
an insulating interlayer structure that contains the wiring structures therein and that includes an air gap between the wiring structures; and
a diffusion barrier layer on a top surface and at least a sidewall of each of the wiring structures,
wherein the diffusion barrier layer covers a sidewall of each of the wiring structures that are adjacent to the air gap, wherein a top surface of the air gap is higher than a top surface of the wiring structures.

2. The semiconductor device of claim 1, wherein the diffusion barrier layer defines a bottom and a sidewall of the air gap, wherein a bottom surface of the air gap is lower than a bottom surface of the wiring structures.

3. The semiconductor device of claim 1, wherein the diffusion barrier layer includes silicon nitride, silicon carbonitride, silicon carboxide, and/or silicon oxycarbonitride.

4. The semiconductor device of claim 1, wherein the insulating interlayer structure includes first and second insulating interlayers that are sequentially stacked, and
wherein the diffusion barrier layer is formed between the first and second insulating interlayers.

5. The semiconductor device of claim 4, wherein a top of the air gap is defined by the second insulating interlayer, and a bottom and a sidewall of the air gap are defined by the diffusion barrier layer.

6. The semiconductor device of claim 4, wherein each of the first and second insulating interlayers includes a low-k dielectric material.

7. The semiconductor device of claim 6, wherein each of the first and second insulating interlayers includes silicon oxide doped with carbon.

8. The semiconductor device of claim 1, wherein each of the wiring structures includes:
a lower portion; and
an upper portion that is integrally formed with the lower portion, the upper portion having a width that is greater than a width of the lower portion.

9. The semiconductor device of claim 1, wherein the metal pattern includes copper, aluminum and/or tungsten, and the barrier pattern includes tantalum nitride, titanium nitride, tantalum and/or titanium.

10. The semiconductor device of claim 1, wherein the central portion of the top surface of the metal pattern is higher than the edge portion of the top surface of the metal pattern.

* * * * *